United States Patent
Burd et al.

(10) Patent No.: US 8,042,027 B1
(45) Date of Patent: Oct. 18, 2011

(54) BM/LLR COMPUTATION FOR MULTI-DIMENSIONAL TCM/BCM

(75) Inventors: Gregory Burd, San Jose, CA (US); Xueshi Yang, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 947 days.

(21) Appl. No.: 12/014,556

(22) Filed: Jan. 15, 2008

Related U.S. Application Data

(60) Provisional application No. 60/885,115, filed on Jan. 16, 2007.

(51) Int. Cl.
*H03M 13/03* (2006.01)

(52) U.S. Cl. ........ 714/786; 714/746; 714/751; 714/752; 714/759; 714/764; 714/777; 714/780; 714/792; 714/794; 714/795; 714/796; 375/241; 375/242; 375/265; 375/324; 375/341

(58) Field of Classification Search ........................ None
See application file for complete search history.

(56) References Cited

U.S. PATENT DOCUMENTS

| | | | | |
|---|---|---|---|---|
| 5,233,629 A * | 8/1993 | Paik et al. | ...... | 375/262 |
| 5,321,725 A * | 6/1994 | Paik et al. | ...... | 375/265 |
| 6,529,559 B2 * | 3/2003 | Reshef | ...... | 375/262 |
| 6,594,319 B1 * | 7/2003 | Shaikh | ...... | 375/265 |
| 6,944,242 B2 * | 9/2005 | Yakhnich et al. | ...... | 375/341 |
| 7,221,714 B2 * | 5/2007 | Shen et al. | ...... | 375/265 |
| 7,593,468 B2 * | 9/2009 | Park et al. | ...... | 375/242 |
| 2002/0067777 A1 * | 6/2002 | Jeong | ...... | 375/324 |
| 2003/0189994 A1 * | 10/2003 | Sommer et al. | ...... | 375/341 |
| 2004/0128610 A1 * | 7/2004 | Wei | ...... | 714/792 |
| 2005/0243941 A1 * | 11/2005 | Anim-Appiah et al. | ...... | 375/265 |
| 2010/0211842 A1 * | 8/2010 | Moon et al. | ...... | 714/748 |
| 2010/0322358 A1 * | 12/2010 | Drumm et al. | ...... | 375/341 |

OTHER PUBLICATIONS

Lin et al. "Trellis-Coded Modulation" Error Control Coding Fundamentals and Applications Second Edition, Chapter 18 pp. 952-1062, 1937.

Ungerboeck "Channel Coding with Multilevel/Phase Signals" IEEE Transactions on Information Theory, vol. IT-28, No. 1, pp. 55-67, Jan. 1982.

* cited by examiner

*Primary Examiner* — John Trimmings

(57) ABSTRACT

Systems and methods for processing and decoding TCM/BCM-coded signal vectors. A multi-dimensional signal vector is received by, for example, a TCM or BCM decoder. The TCM/BCM decoder identifies the closest signal points in the signal constellation set, or "nearest neighbors," for each dimension of the received signal vector. The TCM/BCM decoder then forms a test set that includes a plurality of multi-dimensional test vectors, where each dimension of each test vector is based on an identified nearest neighbor. In particular, each test point in the test set is based on a different combination of the nearest neighbors. The TCM/BCM decoder can compute branch metrics based on only the test points in the test set, and can make detection decisions using the computed branch metrics.

20 Claims, 20 Drawing Sheets

1: Binary Map

2: Euclidean Map

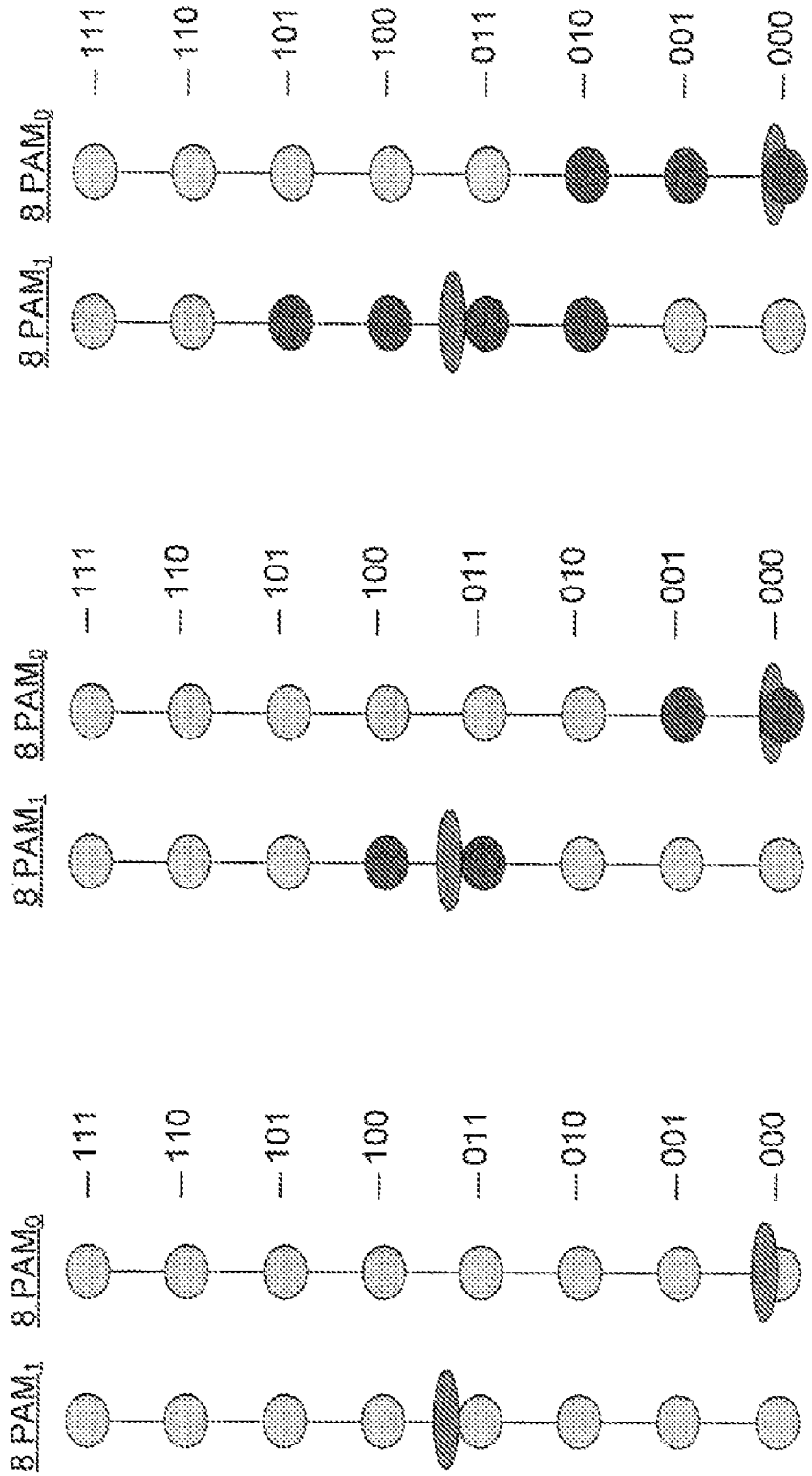

BM/LLR COMPUTATION FOR MULTI-DIMENSIONAL TCM/BCM

CROSS-REFERENCE TO RELATED APPLICATIONS

This claims the benefit under 35 U.S.C. §119(e) of U.S. Provisional Application No. 60/885,115 filed Jan. 16, 2007, which is hereby incorporated herein by reference in its entirety.

BACKGROUND OF THE INVENTION

The disclosed technology relates generally to communication systems, and more particularly, to systems and methods for decoding signal vectors received within communication systems.

To improve the reliability of communication and storage systems, error control coding is commonly applied to the digital information that is conveyed or stored. A suitable error control code is applied to the digital information, which adds redundancy to the data stream. If the same throughput of information is desired in communication, bandwidth expansion is often necessary. Bandwidth expansion refers to an increase in channel bandwidth, typically to allow transmission to occur through the channel with a reduced symbol period. For some channels, especially for those that are low in quality, bandwidth expansion may not be possible or may not be desirable. In these situations, rather than increasing the needed bandwidth, the communication or storage system can utilize modulation schemes with a greater number of signal constellation points. This technique allows for more information to be transmitted at any given time. For example, doubling the number of signal constellation points used for transmission, and therefore doubling the amount of information transmitted each symbol period, may result in substantially the same throughput as maintaining the modulation scheme and doubling the channel bandwidth.

To fully utilize the advantages provided by increasing the number of signal constellation points, the type of modulation and the type of error correcting code should be designed to operate effectively together. This type of data encoding is typically referred to as coded modulation. When a convolutional code is used for the error correcting code, a system typically implements trellis coded modulation (TCM), and when a block code is used, a system typically implements block coded modulation (BCM).

In current systems that employ coded modulation, the TCM or BCM detectors/decoders are highly complex, and require a large amount of resources to operate. In particular, to estimate a received signal vector, the detector/decoder performs many computations that consume a large amount of processing power and/or processing speed. Also, to implement these computations, the detector/decoder may require a large silicon area.

SUMMARY OF THE INVENTION

Accordingly, systems and methods are provided for processing a received signal vector using a technique that consumes fewer resources than conventional systems. Rather than decoding the received signal vector based on every possible interpretation of the received signal vector, the disclosed technique efficiently and effectively forms a set of vectors most likely to be the correct interpretation, and decodes the received signal vector using this set. The disclosed processing technique may be performed in a digital communication or storage system implementing TCM, BCM, or another bandwidth efficient technique.

As used herein, a "signal vector" refers to any signals (or signal) transmitted or received using a modulation scheme with a multi-dimensional signal constellation set (e.g., $(8\ PAM)^2$, $(8\ PAM)^4$, QAM). The term, signal vector, is used regardless of whether the dimensions are implemented spatially, temporally, or in frequency.

A "signal level" refers to an amplitude, phase, or other value associated with a one-dimensional (1D) signal. A "signal constellation point," a "signal point," or a "test point" refers to a signal level in a 1D signal constellation set or a 1D component of a multi-dimensional signal constellation set. Thus, an 8 PAM signal constellation set has eight signal points, each having a different signal level.

Finally, a "signal point vector," or a "test vector," refers to a multi-dimensional vector, where each component of the multi-dimensional vector is associated with a 1D signal constellation set and takes a value of a signal point in that 1D signal constellation set. Thus, a signal point vector for an $(8\ PAM)^4$ signal constellation set would include four dimensions, and each dimension would take on the value of an 8 PAM signal point. Also, each signal vector transmitted or received in the digital communication or storage system may be derived from one of the signal point vectors based on the digital information that is conveyed or stored.

A digital communication or storage system can include a TCM or BCM encoder for transmitting digital information as a signal vector, and a TCM or BCM decoder for receiving the signal vector from a channel separating the encoder and decoder. The signal vector may have any number of dimensions, where each signal component of the signal vector can be multi-level. For example, the TCM/BCM encoder and decoder may utilize $(8\ PAM)^4$ modulation. In this scenario, the encoder and decoder utilize four-dimensional signal vectors made up of signals with eight levels.

The TCM or BCM encoder may map digital information into a multi-dimensional signal vector in three steps. In the first step, the encoder encodes a subset of the digital information using an error correcting code, such as a suitable convolutional code or block code. For example, the TCM/BCM encoder may convert 11 user bits into 12 coded bits by encoding two of the user bits using a rate-$\frac{2}{3}$ convolutional code. The resulting three encoded bits are used to classify the signal point vectors of the modulation scheme into groups referred to as cosets. Continuing the above $(8\ PAM)^4$ example, all of the signal point vectors associated with coded bits of "111" would be grouped in the same coset. For simplicity in describing an embodiment of the invention, this $(8\ PAM)^4$ example will continue to be used frequently below.

The second and third steps performed by the TCM or BCM encoder map the coded bits into signal vectors of the modulation scheme. The second step is referred to as a binary map and the third step is referred to as a Euclidean map. In the binary map, the coded bits produced from the first step are first associated with one of the dimensions of the multi-dimensional modulation scheme. For example, each coded bit may be associated with one of four $(8\ PAM)^4$ dimensions. The binary map then maps corresponding bits in each of the dimensions (e.g., the LSB of each dimension) according to a mapping function. The mapping function is a one-to-one function, and therefore produces a new set of bits for that component of the dimensions. The TCM or BCM encoder may perform three mapping functions—one to map the LSBs, one to map the MSBs, and one to map the center bits of each dimension.

In the Euclidean mapping step, the TCM/BCM encoder converts the binary mapped bits into a signal vector for transmission or storage. The Euclidean map may convert the bits associated with the same dimension into a multi-level signal (e.g., an 8 PAM signal). The TCM/BCM encoder may perform the Euclidean map using a natural labeling of the signal points. For example, if a dimension is associated with the bits, "011" (binary for three), the third signal point of the 8 PAM signal set may be transmitted for that dimension. By converting each dimension into a multi-level signal, the TCM/BCM encoder is able to transmit or store a multi-dimensional signal vector with multi-level components.

The TCM or BCM decoder of the communication or storage system receives the transmitted or stored signal vector after the signal vector has been distorted, or otherwise altered, by a communication or storage channel. For each dimension of the received signal vector, the TCM/BCM decoder finds the closest signal points, referred to as nearest neighbors, to the received signal. For instance, the TCM/BCM decoder may identify two of the 8 PAM signal points that are closest in Euclidean distance to each signal component of the received signal vector. Using the nearest neighbors, the TCM/BCM decoder may form a test set for the received signal vector. In one implementations, the test set includes a plurality of signal point vectors, where each signal point vector is a different combination of the identified nearest neighbors. If two nearest neighbors are identified in each dimension, the test set includes $2^4=16$ test vectors. Depending on the channel and noise characteristics of the communication or storage system, these test vectors may be most likely to correspond to signal vector that was actually transmitted by the TCM/BCM encoder.

The TCM/BCM decoder may detect the digital information conveyed within the signal vector using a Viterbi detector that is matched to the error correcting code used by the TCM/BCM encoder. The error correcting code, however, was originally applied to only a subset of the transmitted bits. Therefore, each branch in the trellis diagram searched by the Viterbi detector corresponds to multiple combinations of bits. In fact, each branch corresponds to all of the bit combinations that are within the same coset, as described above. Therefore, the Viterbi detector can be used only to identify the coset that the transmitted signal vector belongs in. The TCM/BCM decoder may then make the final detection decision by comparing some or all of the bit combinations in the identified coset to the received signal vector, and can compute either hard estimates or soft estimates (e.g., LLRs) of the transmitted or stored digital information.

In order for the Viterbi detector to operate, the TCM/BCM decoder computes branch metrics to enable the Viterbi detector to identify a path through the trellis diagram. Because each branch is associated with multiple signal point vectors, one way to compute the branch metrics would be to consider every possible signal point vector associated with coset. However, for the $(8\ PAM)^4$ example, each coset includes 512 signal point vectors, making this approach to branch metric computation expensive to implement. Instead, the TCM/BCM detector may compute branch metrics based on only the test vectors in the test set. If the binary mapping described above is appropriately designed, the test set includes at least two test vectors for each branch. Thus, the test set includes sufficient information to compute branch metrics for every branch in the trellis diagram. Using this approach, two test vectors would be used to compute each branch metric as opposed to 512 test vectors. Furthermore, because the test set is formed using nearest neighbors, one of the test vectors for each branch corresponds to the closest (and therefore most likely) signal point vector to the received signal vector. Therefore, this decoding approach is considerably less resource-intensive than those used in conventional decoding systems.

BRIEF DESCRIPTION OF THE DRAWINGS

The above and other aspects and advantages of the invention will be apparent upon consideration of the following detailed description, taken in conjunction with the accompanying drawings, in which like reference characters refer to like parts throughout, and in which:

FIG. 18 shows a graphical representation of an illustrative received signal vector with two 8 PAM components;

FIGS. 19 and 20 illustrate an inadequate and adequate set, respectively, of nearest neighbors needed to form a test set T(r) for the received signal vector of FIG. 18;

DETAILED DESCRIPTION OF THE INVENTION

Figure 1:
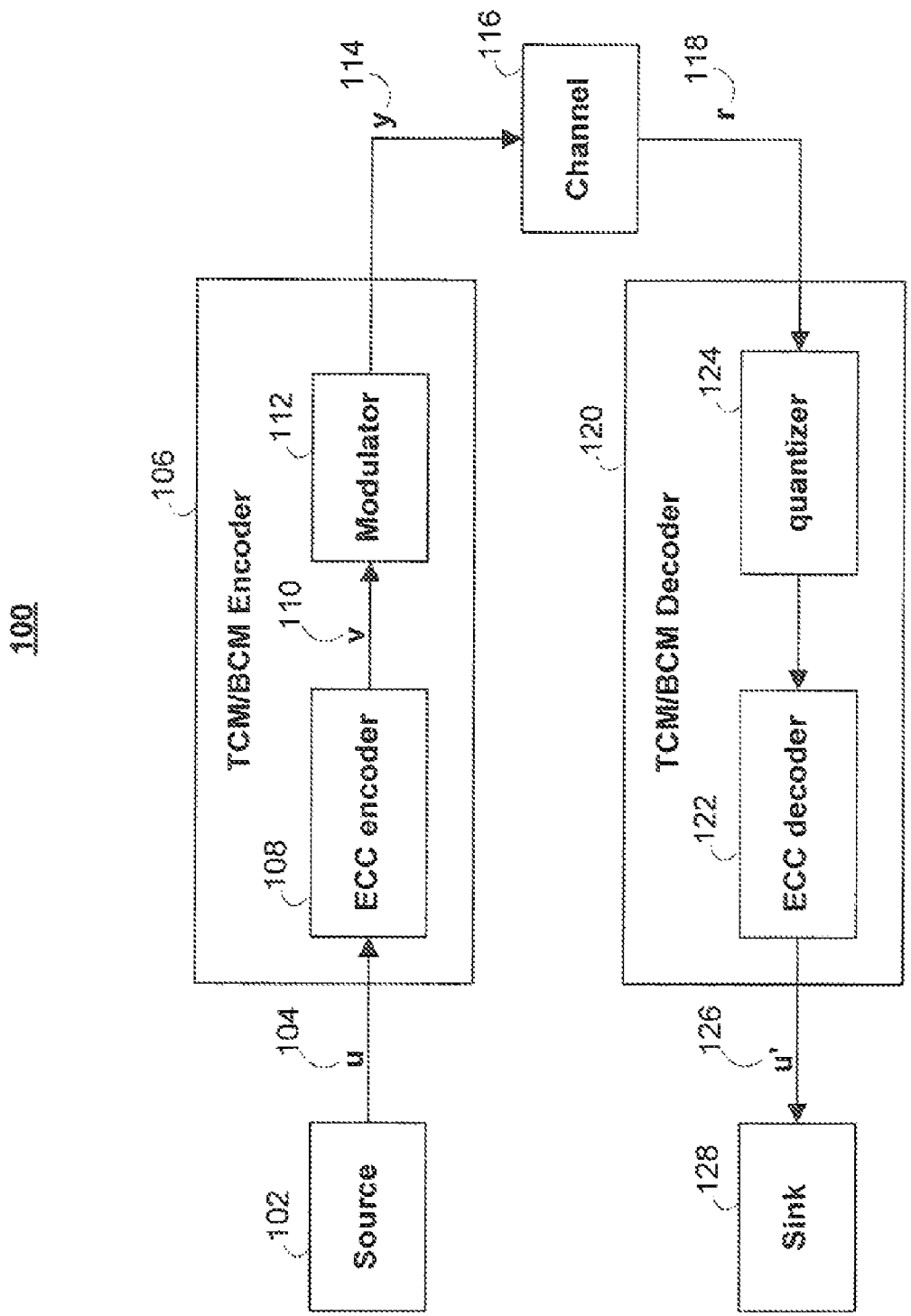
FIG. 1 shows a simplified block diagram of a data transmission or storage system.

FIG. 1 shows a simplified block diagram of digital transmission or storage system 100. Digital transmission or storage system 100 can include source 102, TCM/BCM encoder 106, channel 116, TCM/BCM decoder 120, and sink 128. System 100 may be used to transmit digital information from source 102 to sink 128. Source 102 may be any suitable source for storing or providing the digital information. For example, source 102 may be, but is not limited to, a source encoder, an encoder for an error correcting/detecting code (e.g., a convolutional encoder, a Reed-Solomon encoder, a CRC encoder, an LDPC encoder, a Turbo code encoder, etc.), a magnetic storage device (e.g., a hard disk), an electrical storage device (e.g., FLASH memory or RAM), or an optical storage device (e.g., a CD-ROM). The digital information provided from source 102 to sink 128 can represent any type of information to be conveyed (e.g., a sampled/quantized version of an analog signal, binary information, etc.) and can be in any suitable digital form (e.g., encoded data, uncoded data, etc.).

The digital information may be transferred from source 102 to sink 128 using one or more information-carrying signals. The information-carrying signals may be transferred through a transmission or storage medium that degrades the signals. The medium may also cause the signals to be affected by additive signal-dependent or signal-independent noise. The effect of this signal-altering medium is represented in FIG. 1 by channel 116. Channel 116 may have properties based on any suitable medium through which information-carrying signals can be transferred, such as any wired or wireless channel. In some embodiments, the noise of channel 116 may be modeled as additive white Gaussian noise (AWGN).

Due to the effects of channel 116, reliable information transfer may be obtained using TCM/BCM encoder 106 and TCM/BCM decoder 120. TCM/BCM encoder 106 may prepare the digital information, referred to herein by the symbol u, obtained from source 102 for transmission through channel 116. The resulting information-carrying signal or signal vector is referred to herein by the symbol y. TCM/BCM encoder 106 may encode digital information u based on any suitable convolutional code (for TCM) or block code (for BCM). For example, TCM/BCM encoder 106 may encode the digital information based on a suitable rate-½ or rate-⅔ convolutional code, or a suitable (n, k, d) block code. This function of TCM/BCM encoder 106 is embodied in convolutional/block encoder 108, which produces coded digital information 110. A coded digital information sequence is referred to herein by the symbol v.

In addition to coding, TCM/BCM encoder 106 may include modulator 112 for modulating v. Modulator 112 may convert v to a signal or signal vector 114 based on a suitable modulation scheme. The signal or signal vector is referred to herein by the symbol, y. For each signal or signal component of a signal vector, the modulation scheme applied by modulator 112 may be a binary-level scheme, such as 2 PAM, or a multi-level modulation scheme, such as 4 PAM, 8 PAM, 16 PAM, or 64 PAM. Other suitable modulation schemes that TCM/BCM encoder 106 may utilize include an M-level quadrature amplitude modulation (QAM), phase shift keying (PSK), or orthogonal frequency division multiplexing (OFDM) scheme. In general, TCM/BCM encoder 106 may utilize signal constellation sets of one or more dimensions (e.g., a 2D (8 PAM)$^2$ set, a 4D (8 PAM)$^4$ set). The dimensions can be implemented spatially (e.g., for MIMO systems), in frequency (e.g., orthogonal carrier frequencies), or in time (e.g., sequentially).

The coding and modulation techniques implemented by encoder 108 and modulator 112, respectively, may be associated or designed to operate effectively together. This is typically referred to as coded modulation, and is a type of bandwidth efficient communication. That is, coded modulation does not require bandwidth expansion to maintain the same throughput as transferring uncoded data, even though redundancy is added to the digital stream. In some embodiments, rather than having a separate ECC encoder and modulator, as shown in FIG. 1, a TCM/BCM encoder may integrate these functions into a single component. Also, although encoder 106 is shown to utilize trellis coded modulation (TCM) or block coded modulation (BCM), encoder 106 may alternatively utilize another bandwidth efficient technique.

With continuing reference to FIG. 1, because of the effects of channel 116, signal or signal vector 118 received by TCM/BCM decoder 120 (referred to herein by the symbol, r) may be a distorted or noisy version of signal or signal vector 114. TCM/BCM decoder 120 interprets signal or signal vector 118 and attempts to recover digital information 104 from signal or signal vector 118. Output sequence 126 of TCM/BCM decoder 120 may be any suitable estimate of the digital information 104. For example, output sequence 126 may be a hard bit estimate of digital information 104 or may be a soft estimate (e.g., in the form of LLRs). TCM/BCM decoder 120 may be implemented by quantizer 124 and convolutional/block decoder 122. These components may be matched to their corresponding components in TCM/BCM encoder 106. For example, if ECC encoder 108 is a rate-½ convolutional code encoder, ECC decoder 108 may be a Viterbi-based decoder matched to the rate-½ convolutional code encoder. In some embodiments, ECC decoder 122 and quantizer 124 may be combined into a single unit.

Figure 2:
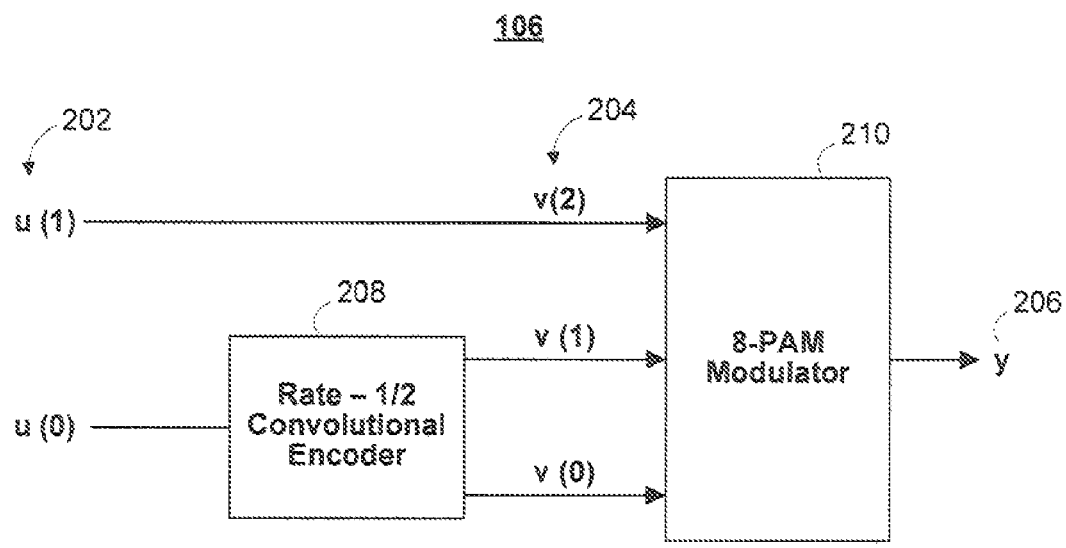
FIG. 2 shows a simplified block diagram of a TCM encoder.

FIG. 2 shows one embodiment of TCM/BCM encoder 106 for a one-dimensional modulation scheme. Multi-dimensional encoders will be described in detail below. Here, ECC encoder 108 (FIG. 1) is shown as rate-½ convolutional code encoder 208 that converts one input bit, u(0), into two output bits, v(0) and v(1). Encoder 208 may be implemented according to any suitable code and using any suitable technique. For example, encoder 208 may be implemented according to the block diagram of FIG. 3, which is specified by the parity check matrix, H=[1+D$^2$, D]. In this embodiment, encoder 208 has a memory order of two, since encoder 208 includes two delay elements, registers 302 and 304. Thus, two previous bits of u(0) affect the current output of v(0).

Figure 6:
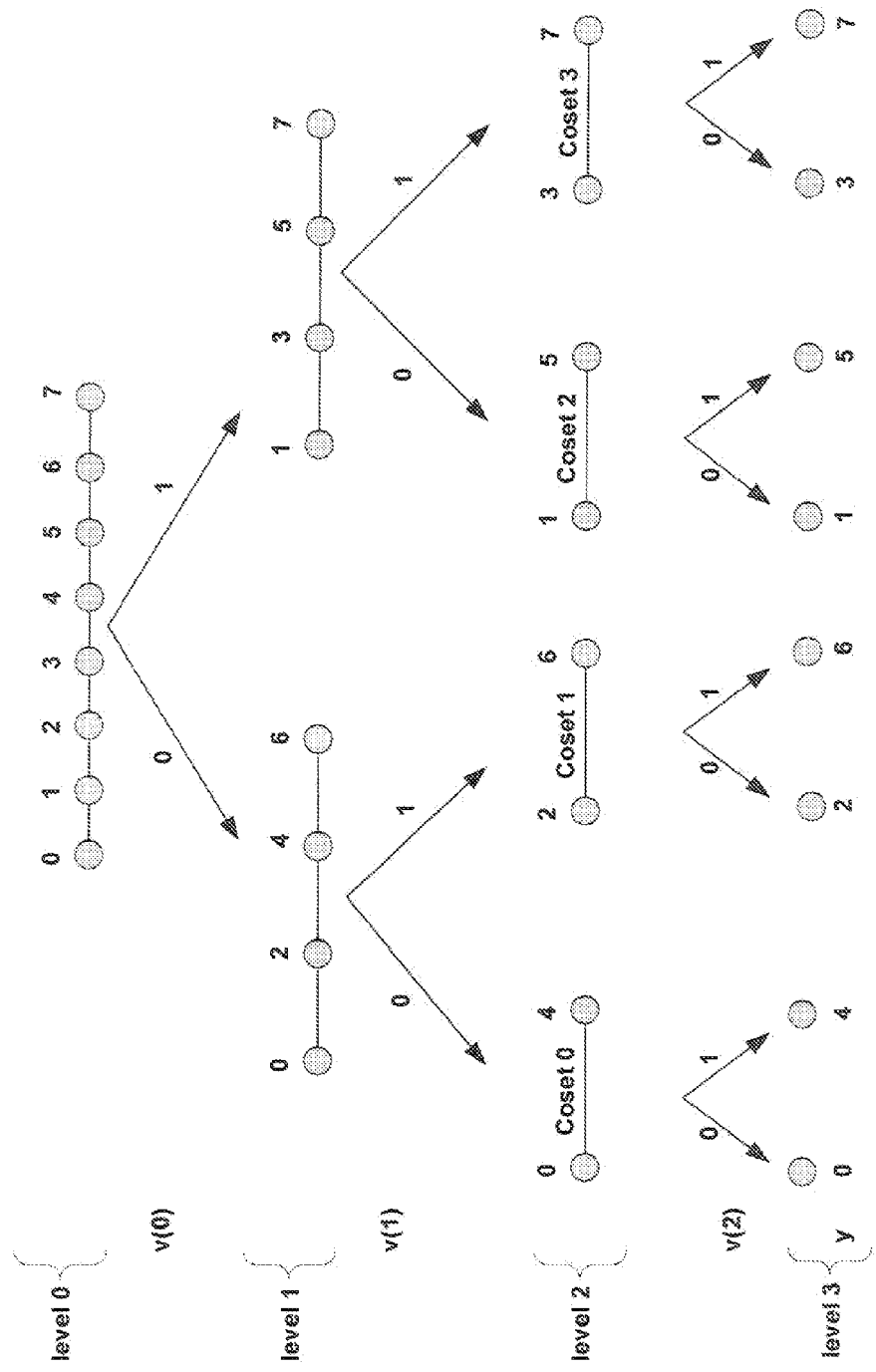
FIG. 6 shows a tree diagram that illustrates set partitioning.

Referring again to FIG. 2, modulator 112 (FIG. 1) is shown as 8 PAM modulator 210 that maps three bits of information into an amplitude according to an 8 PAM signal constellation set. A signal constellation set for an 8 PAM scheme is illustrated in FIG. 6. The bits provided to 8 PAM modulator 210 are each one of two types: a coded bit from encoder 208 or an uncoded user bit. In one implementation, the encoded bits form the least significant bits (LSBs) of the input bits to modulator 210.

Figure 4:
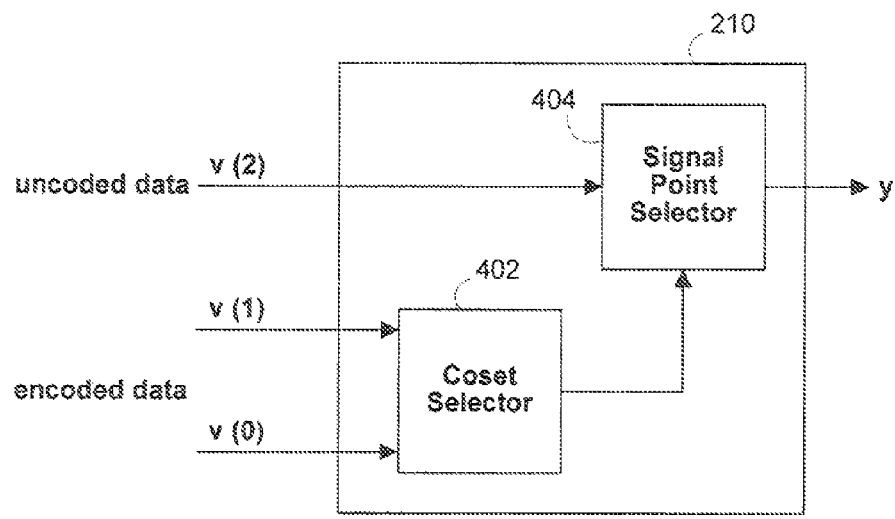
FIG. 4 shows a simplified block diagram of a modulator for a TCM encoder.
Figure 5:
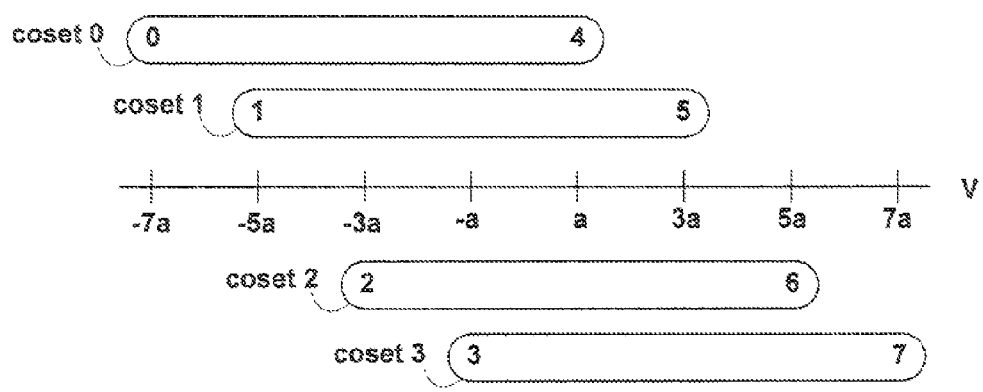
FIG. 5 shows illustrative cosets of signal points for an 8 PAM signal constellation set.

FIG. 4 shows a simplified block diagram of 8 PAM modulator 210 (FIG. 2) in accordance with one embodiment of the present invention. Modulator 210 includes two components, coset selector 402 and signal point selector 404, that allow bits to be mapped to signals in two steps. In the first step, coset selector 402 selects a subset of the signal points in the 8 PAM scheme, referred to as a coset, based on the values of the encoded bits (e.g., bits from encoder 208 of FIG. 2). An example of how the signal points may be grouped into cosets is shown in FIG. 5. With two encoded bits, v(1) and v(0), a total of four cosets may be distinguished. For example, v(1) and v(0) may take on the values, {v(1), v(0)}="00" (zero), {v(1), v(0)}="01" (one), {v(1), v(0)}="10" (two), and {v(1), v(0)}="11" (three), which may be used to select between cosets 0 through 3 of FIG. 5. Thus, in some embodiments, coset selector 402 may determine which of the four cosets of FIG. 5 the coded digital information bits, v, belong in.

Signal point selector 404 (FIG. 4) may select a signal point within a particular coset based on the value of the uncoded data, v(2). The particular coset may be identified based on coset information provided by coset selector 402. Continuing the above example, and assuming that coset 2 was selected by coset selector 402, signal point selector 404 may transmit either signal point 2 or signal point 6 depending on the value of v(2). Coset selector 402 may provide coset information to signal point selector 404 using any suitable format that allows signal point selector 404 to identify the appropriate coset from which to choose a signal point. In some embodiments, coset selector 402 may provide offset information, such as voltage offset information. For example, if the 8 PAM signal points are each separated by a voltage difference of 2 a and take on voltages of {−7 a, −5 a, −3 a, −a, a, 3 a, 5 a, 7 a}, coset selector 402 may provide a voltage offset of zero volts when coset 0 is selected, or an offset of 4 a volts when coset 2 is selected (because the signal points of coset 2 are offset from those of coset 0 by 4 a volts). This allows signal point selector 404 to initially assume that coset 0 is being used, and select either −7 a volts or a volts based on the value of v(2). Signal point selector 404 may then add the offset voltage provided by coset selector 402 to obtain the final voltage that should be used for transmission. For example, assuming again that coset 2 is selected, signal point selector 404 may add offset voltage 4 a to either −7 a or a to obtain −3 a volts and 5 a volts, the signal points in coset 2.

Although modulator 210 is illustrated in FIG. 4 as having two encoded data bits and one uncoded data bit, this is merely illustrative. More generally, there may be any suitable number of encoded and uncoded data bits, allowing for cosets of varying size and each with a varying number of signal points.

The cosets of FIG. 5 may be derived from a technique typically referred to as set partitioning. Set partitioning operates starting from the full signal constellation set. The signal set is repeatedly divided in stages, producing an increasing number of cosets at each stage. The signal set may be divided such that, at each stage, the minimum intra-coset distance is maximized. Set partitioning of this type is illustrated in FIG. 6 for an 8 PAM signal set. Starting from level 0, which includes all eight signal points in the 8 PAM signal set, the signal points may be divided into two cosets of four points each in level 1. The signal points are divided such that neighboring signal points in level 0 are selected for different cosets in level 1, which in this case maximizes the minimum distance between neighboring signal points in level 1. In particular, using a Euclidean distance metric given by, $\|s_1 - s_2\|^2$, where $s_1$ and $s_2$ are signal points, the minimum intra-coset distance in level 1 is 4 a. Thus, mathematically, selecting points for each coset in the next level, and for any subsequent level, satisfies the equation, $$d_{min}^2 = \min_{coset} \left\{ \min_{s_1, s_2 \in coset} (\|s_1 - s_2\|^2) \right\}. \quad (1)$$

Using a similar procedure as that described above, the two cosets of level 1 may be divided into four cosets in level 2, each with two signal points. The four cosets in level 2 correspond to those illustrated in FIG. 5, and the minimum distance between the signal points within each coset is now 8 a. Finally, the cosets in level 2 may be divided into single-point cosets in level 3.

The set partitioning strategy of FIG. 6 can also illustrate a technique used by an 8 PAM modulator (e.g., 8 PAM modulator 210 of FIGS. 2 and 4) for converting input bits into signals. The value of the input bits (e.g., v(0), v(1), and v(2)) may determine which coset to traverse between levels. For example, the binary value of v(0) may determine whether the coset of odd signal points is traversed or whether the coset of even signal points is traversed. Similarly, given a particular level 1 coset from which to branch off from, the value of v(1) may be used to identify a particular coset within level 2. Thus, as described above in connection with FIGS. 4 and 5, the encoded data bits, v(0) and v(1), can be used to identify the coset that includes the appropriate signal point. This signal point may be identified based on the bit value of the uncoded data bit, v(2).

Figure 7:
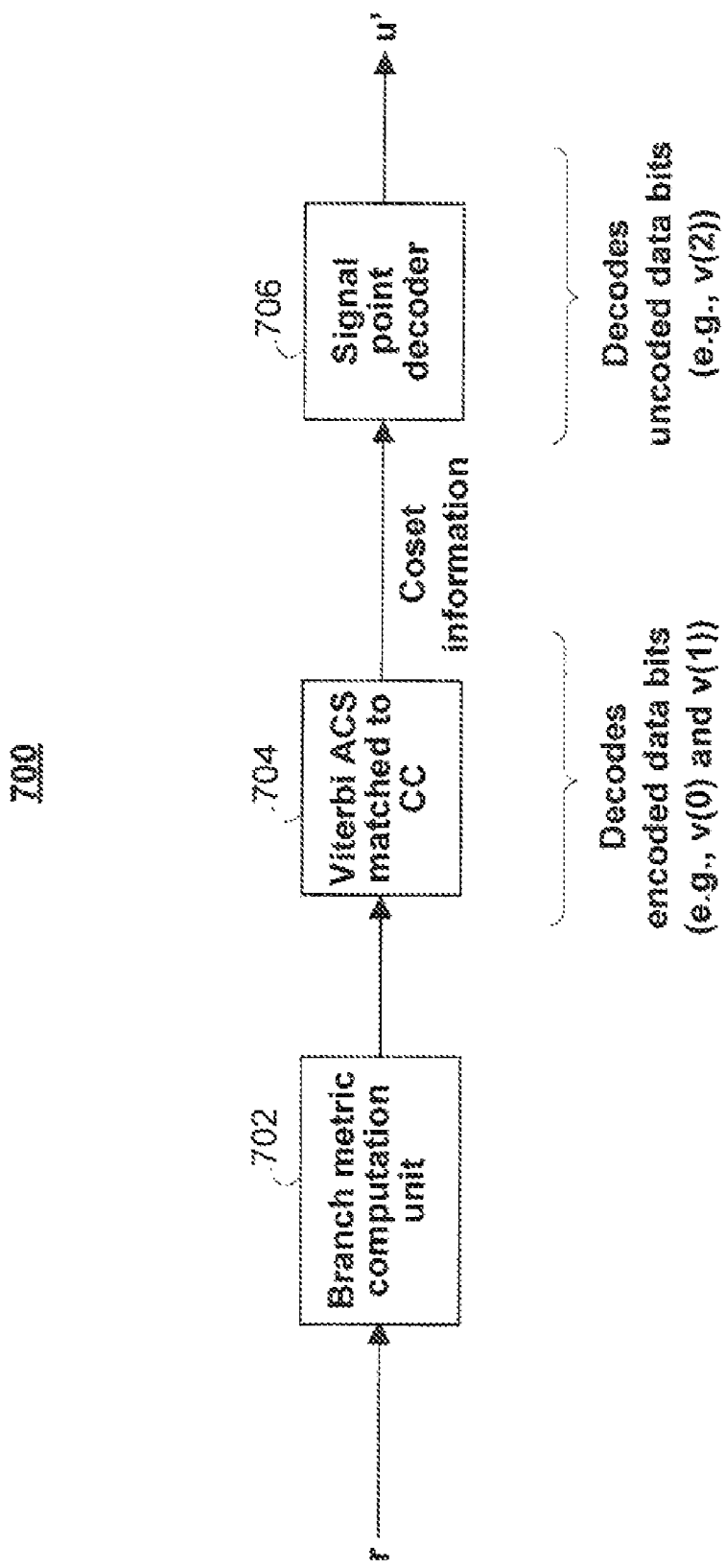
FIG. 7 shows a simplified block diagram of a TCM decoder.

Referring now to FIG. 7, an illustrative and simplified block diagram of TCM decoder 700 is shown. TCM decoder 700 may be implemented as part of TCM/BCM decoder 120 of FIG. 1. TCM decoder 700 can include branch metric computation unit 702, Viterbi add-compare-select (ACS) unit 704, and signal point decoder 706. Viterbi ACS unit 704 may be matched to the convolutional code of the corresponding encoder, such as rate-½ convolutional code encoder 208 of FIG. 2. As described above, convolutional code encoder 208 is associated with a subset of the transmitted bits (e.g., v(0) and v(1) of FIG. 2). Thus, using branch metrics computed by branch metric computation unit 702, Viterbi ACS unit 704 may decode this subset of bits to recover a subset of the original data bits (e.g., u(0)). In addition, because the subset of encoded bits also defines the coset that the transmitted signal belongs in, Viterbi ACS unit 704 may provide signal point decoder 706 with coset-identifying information.

Signal point decoder 706 may use the coset information provided by Viterbi ACS unit 704 to recover the subset of data bits that were originally uncoded (e.g., u(1), or equivalently, v(2) of FIG. 2). To recover this information, signal point decoder 706 may compare the value of the received signal, r, to the signal points associated with the identified coset, and may determine the signal point in the coset that is most likely to correspond to the transmitted signal. Examples of the operation of signal point decoder 706, as well as branch metric computation unit 702 and Viterbi ACS unit 704, will be described below in connection with FIG. 8.

Figure 3:
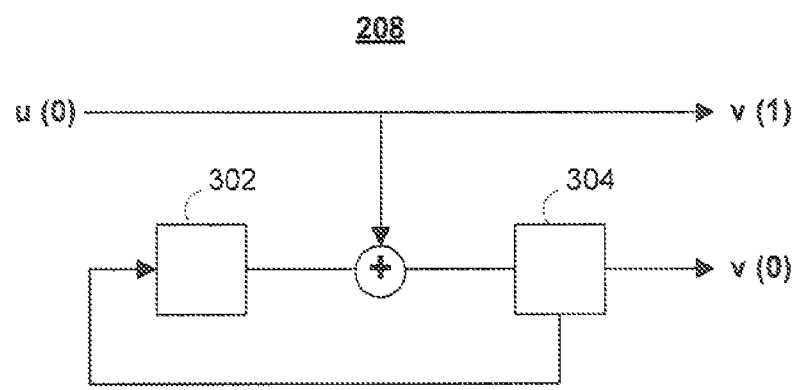
FIG. 3 shows an illustrative rate-½ convolutional code encoder.
Figure 8:
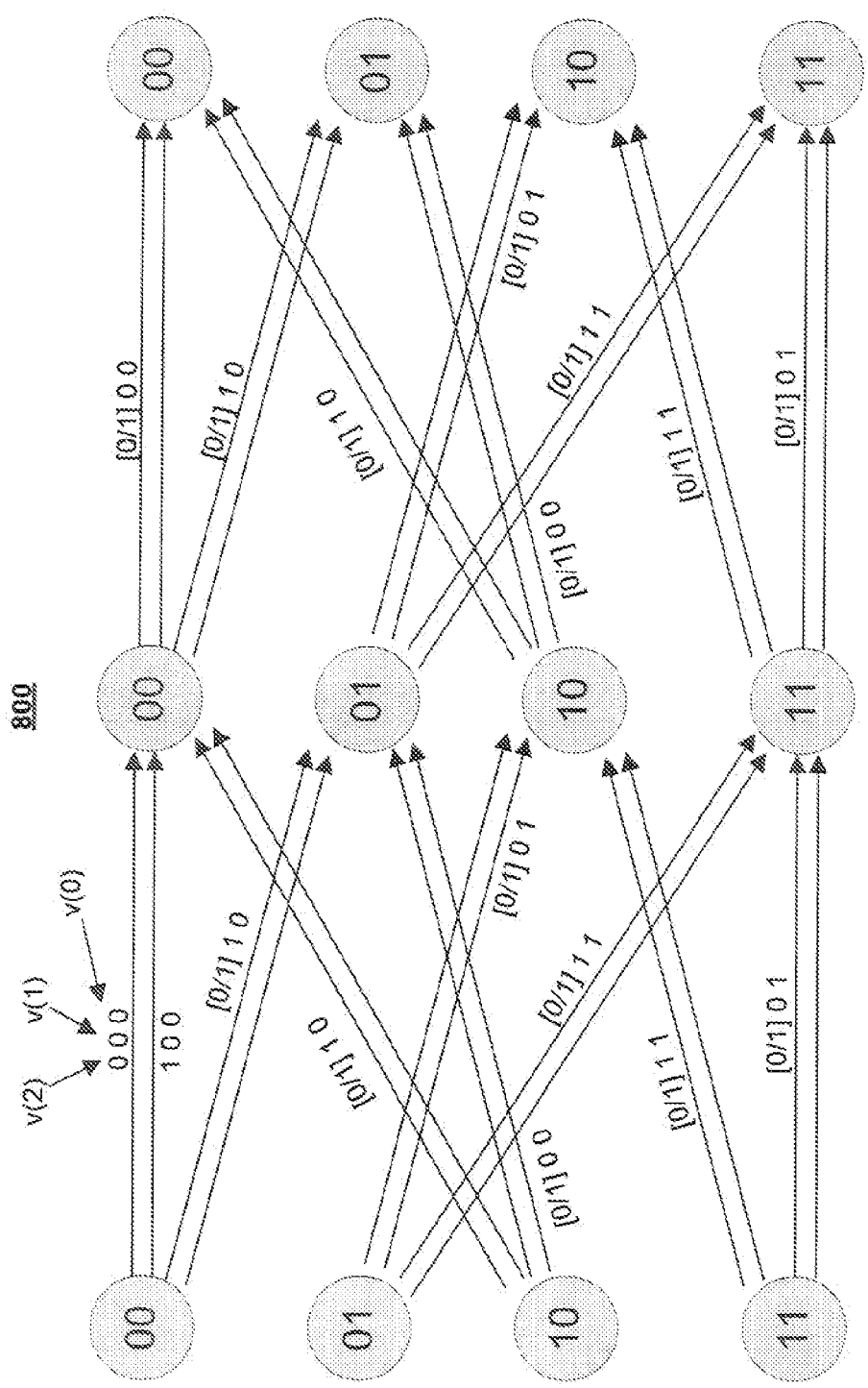
FIG. 8 shows a trellis diagram that illustrates Viterbi-based detection used by the TCM decoder of FIG. 7.

In general, a Viterbi detector is a maximum-likelihood detector that operates by finding the most likely path through a corresponding trellis diagram. The states and the branches of the trellis diagram are defined by the ECC code used to encode the received information. The trellis diagram associated with the ½-rate convolutional encoder of FIG. 3 is shown in FIG. 8. Trellis diagram 800 of FIG. 8 includes four states at each time interval, because convolutional code encoder 208 (FIG. 3) has two memory elements. Thus, four total two-bit combinations are possible within these memory elements: "00," "01," "10," and "11."

In addition, trellis diagram 800 of FIG. 8 includes branches connecting states from one time interval to the next. Each branch from one state (e.g., "00") to another state (e.g., "00") is associated with a possible value of v(0) and v(1). For example, a branch from a "00" state to the next "00" state is associated with values v(0)=0 and v(1)=0, and a branch from a "11" state to a "10" state is associated with values v(0)=1 and v(1)=1. Trellis diagram 800 includes two parallel branches connecting each state that are both associated with the same values for v(0) and v(1). One of the parallel branches, however, corresponds to an uncoded bit value of v(2)=0, the other to an uncoded bit value of v(2)=1. Accordingly, each set of parallel branches is labeled using the format, "[0/1] X X," to indicate that each branch is associated with three bits, where the parallel branches differ in only the last bit, v(2). Thus, the value of the uncoded bit has no bearing on the path between states. However, by showing the different values of v(2) using separate branches, the trellis diagram of FIG. 8 illustrates every possible combination of v(0), v(1), and v(2), and for each possible combination of memory element states.

With continuing reference to FIG. 8, an ideal detector would find an exact path through trellis diagram 800. For example, the ideal detector may compute branch metrics for all 16 branches departing from the states in a time interval. The branches may be computed according to, $$BM = (r - y(v_0, v_1, v_2))^2, \quad (2)$$

and the ideal detector could identify a path through any of the 16 branches based on the associated branch metric and an accumulated path metric.

However, detection can be simplified by collapsing the parallel branches into a single branch, effectively ignoring v(2) for the time being, and finding a path through the collapsed trellis diagram. Once the path is identified, the value of the uncoded bit, v(2), may be determined based on the received signal vector and on the identified values of v(0) and v(1). This is also the technique employed by TCM decoder 700 of FIG. 7, where a coset is identified first, followed by the remaining uncoded bits. In fact, each set of parallel branches in trellis diagram 800 corresponds to a particular coset, and each branch is associated with a signal point in the corresponding coset.

Thus, now referring to both FIGS. 7 and 8, TCM decoder 700 can operate by computing branch metrics associated with the collapsed branches of trellis diagram 800, identifying the most likely path through the collapsed branches, and identifying one of the actual branches for each collapsed branch in the selected path. These tasks may be accomplished by branch metric computation unit 702, Viterbi ACS unit 704, and signal point decoder 706, respectively. In some embodiments, branch metric computation unit 702 may compute branch metrics according to, $$BM = \ln\{e^{-(r-s(v_0,v_1,0))^2} + e^{-(r-s(v_0,v_1,1))^2}\}. \quad (3)$$

Equation (3) models any noise on the received signal as AWGN. Alternatively, branch metric computation unit 702 may compute branch metrics according to, as an approximation, $$BM = \min\{(r-s(v_0,v_1 0))^2, (r-s(v_0,v_1 1))^2\}. \quad (4)$$

Using the computed branch metrics, Viterbi ACS unit 704 may identify the most likely path through the collapsed trellis diagram using the Viterbi algorithm. Viterbi ACS unit 704 can be replaced by any other suitable module that can identify an appropriate path through the collapsed trellis diagram.

Once a collapsed branch is identified as being part of the selected path, signal point decoder 706 may identify one of the parallel branches associated with the collapsed branch as the actual branch that is traversed. Signal point decoder 706 may select the branch associated with the signal point closest in Euclidean distance to the received signal, r. For example, if a collapsed branch associated with v(1)=1 and v(0)=0 is chosen by Viterbi ACS unit 704, the two parallel branches for that collapsed branch correspond to y="010" (two) and y="110" (six). Thus, if the received signal is r=2.5, signal point decoder 706 can compute Euclidean distances, $$(r - y(v_0, v_1, v_2))^2 = (2.5-6)^2 = 12.25, \text{ and} \quad (5)$$

$$(r - y(v_0, v_1, v_2))^2 = (2.5-2)^2 = 0.25. \quad (6)$$

In this scenario, signal point decoder 706 may select y="010" corresponding to v(2)=0, v(1)=1, and v(0)=0, and may output this result as the detection decision of TCM decoder 700. Alternatively, signal point decoder 706 may simply output the decoded version of these bits, which in this example would be u(1)=0 and u(0)=1.

As described above, the embodiments of the present invention can be extended to any suitable number of uncoded bits and any suitable number of encoded bits. The convolution encoder (if a convolutional code is used) may also have any suitable memory order. Therefore, trellis diagram 800 is merely illustrative, and a trellis diagram of a varying number of states, bits per branch, and parallel branches may be used. Accordingly, branch metric computation unit 702, Viterbi ACS unit 704, and signal point decoder 706 may be implemented to correspond to any of these suitable trellis diagrams.

Figure 9:
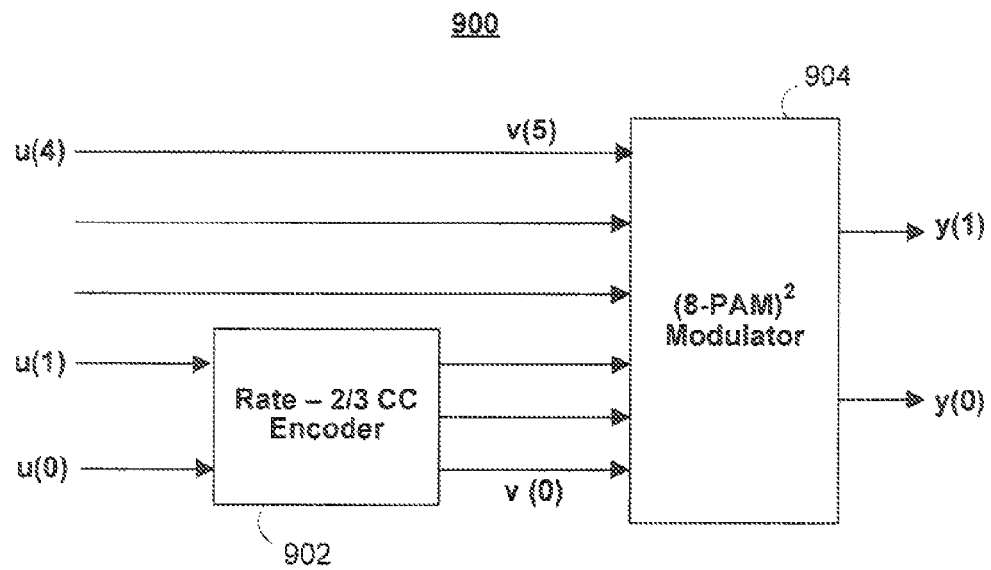
FIG. 9 shows a simplified block diagram of a two-dimensional TCM encoder.
Figure 10:
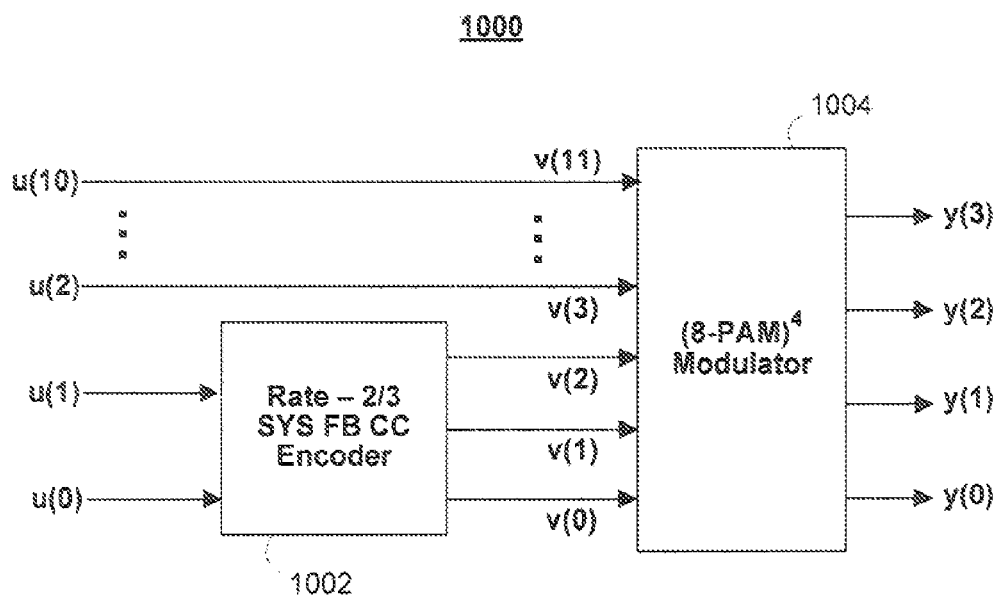
FIG. 10 shows a simplified block diagram of a four-dimensional TCM encoder.

The embodiments described thus far have been for one-dimensional signal sets, and in particular one-dimensional 8 PAM signal sets. However, the present invention can be extended to multi-dimensional signal sets, such as an (8 PAM)$^4$ signal set, or any other suitable type of M-dimensional constellation sets. FIGS. 9 and 10 illustrate TCM encoders for multi-dimensional modulation schemes of two different dimensions. TCM encoder 900 of FIG. 9 shows a simplified block diagram of an encoder for a two-dimensional (8 PAM)$^2$ signal set, and TCM encoder 1000 of FIG. 10 shows a simplified block diagram of an encoder for a four-dimensional (8 PAM)$^4$ signal set.

Referring first to FIG. 9, TCM encoder 900 includes rate-⅔ convolutional code encoder 902 and modulator 904 for converting five user data bits to two 8 PAM signals. First, convolutional code encoder 902 may convert the two least significant bits of the user data, u(0) and u(1), to three coded bits, v(0) through v(2). Thus, the inputs into modulator 904 include three encoded bits, v(0) through v(2), and three uncoded bits, v(3) through v(5). As derivable from the descriptions above, this combination of encoded and uncoded bits may correspond to signal points divided into eight cosets (because of the three encoded bits), with eight signal points in each coset (because of the three uncoded bits).

Referring now to FIG. 10, TCM encoder 1000 includes rate-⅔ convolutional encoder 1002 and modulator 1004. Convolutional encoder 1002 may first convert eleven user data bits, u(0) through u(10) to twelve bits, v(0) through v(11), by converting the least significant two user bits to three encoded bits. The two LSBs may be converted using a convolutional code based on a parity check matrix given by H(D)=[D, D$^2$, 1+D+D$^2$]. Following the conversion to twelve bits, modulator 1004 may further convert these bits into four 8 PAM signals. Modulator 1004 may convert the twelve bits by performing set partitioning, as described above in connection with FIG. 6, separately for each of the four 8 PAM dimensions. A technique for set partitioning in systems with multi-dimensional signal constellation sets is described in greater detail in Ungerboeck, "Channel Coding with Multi-level/Phase Signals," IEEE Transactions on Information Theory, IT-28:55-67, January 1982.

With continuing reference to FIG. 10, the inputs into modulator 1004 include three encoded bits and nine uncoded bits. The resulting four-dimensional signal vector produced by modulator 1004 may be grouped into $2^3=8$ cosets, each with $2^9=512$ signal points. The corresponding trellis diagram would have eight states with 512 parallel branches connecting the states. After collapsing the 512 parallel branches, a branch metric computation unit (e.g., branch metric computation unit 702) may compute branch metrics for each collapsed branch according to, $$BM(coset\ i) \approx \min_{s=(s_0,s_1,s_2,s_3) \in i\text{-}th\ coset} \left\{ \sum_{j=0}^{3} (r_j - s_j)^2 \right\}, \qquad (7)$$

where $r_j$ is the received signal for the jth dimension and $s_j$ is a signal point in the jth dimension. Equation (7) is an extension of equation (4), described above, to four dimensions, and specifies that a branch metric for the ith coset can be approximated by the smallest sum of the Euclidean distances between components of the received signal vector, $r=\{r_0, r_1, r_2, r_3\}$, and components of a four-dimensional signal point vector, $s=\{s_0, s_1, s_2, s_3\}$, in the ith coset. Thus, to find the minimum quantity for equation (7), the branch metric computation unit computes 512 Euclidean distances for the 512 parallel branches in coset i. This computation may be expensive in terms of hardware utilization (e.g., silicon area), processing speed, processing power, or any other hardware, software, or firmware resource. Accordingly, in one embodiment, a TCM decoder (or any other type of decoder for a bandwidth efficient communication scheme) is implemented that can reduce the number of signal point vectors that need to be considered.

Equation (7) above is merely illustrative, and any suitable branch metric computation may be performed by branch metric computation unit 702. For example, rather than minimizing the sum of Euclidean distances, a different distance metric can be used.

Figure 11:
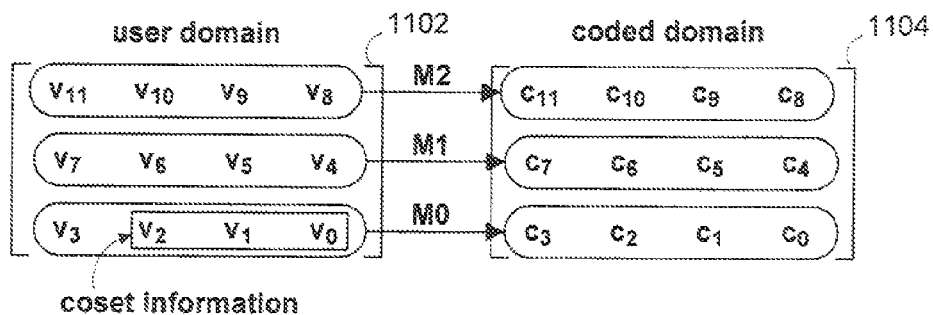
FIG. 11 illustrates binary mapping from a user domain to a coded domain.
Figure 12:
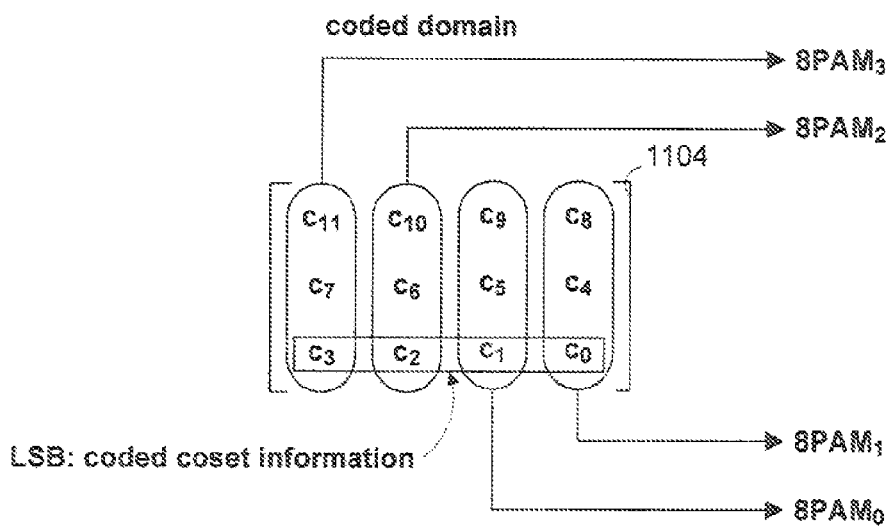
FIG. 12 illustrates Euclidean mapping from a coded domain to a signal set.

A more detailed signal mapping technique for converting twelve data bits to an $(8\ PAM)^4$ signal will be described herein in connection with FIGS. 11 and 12. The mapping may be performed by a TCM encoder (e.g., TCM encoder 1000 of FIG. 10). In one embodiment, the TCM encoder formats digital information in a way that allows a corresponding TCM decoder to compute branch metrics using a less resource-consuming technique than that described above. The mapping from user bits to signal points may be contemplated as a two step mapping process. The first step will be referred to herein as a binary map, and is illustrated in FIG. 11. The second step will be referred to herein as a Euclidean map, and is illustrated in FIG. 12.

Referring first to FIG. 11, a binary map is illustrated for converting twelve bits from a user domain to a coded domain. The bits in the user domain may correspond to input bits v(0) through v(11) of modulator 1004 (FIG. 10), where v(0) through v(2) are encoded bits produced by a rate-⅔ convolutional encoder, and v(3) through v(11) are uncoded digital information. Although some of the bits of v are derived from an encoder, these bits will be referred to as being in the user domain for purposes of describing the signal mapping. The twelve user bits can be arranged in FIG. 11 into 3×4 matrix 1102. The four dimensions of the $(8\ PAM)^4$ signal set are represented by the four columns of matrix 1102, where the MSB of each dimension can be found in the first row of matrix 1102, and the LSB of each dimension can be found in the bottom row. Thus, as shown in FIG. 11, the three bits of coset information are located in the LSB position of the rightmost three dimensions.

Matrix 1102 of the user domain can be mapped into matrix 1104 of a coded domain. Each row, i, of matrix 1102 can be mapped into the ith row of matrix 1104 using a suitable binary mapping function, $M_i$. The three binary mapping functions, $M_0$ through $M_2$, of FIG. 11 can be the same function or can be different functions. For simplicity in describing the present invention, it will be assumed that the three mapping functions are the same. This, however, is merely illustrative and is not intended to be limiting.

In one embodiment, the binary mapping function for each row of matrix 1102 may be given by, $$(c_3, c_2, c_1, c_0) = \sum_{i=0}^{3} \bigoplus v_i L_i, \quad v_i \in GF(2) \qquad (8)$$

where the $c_i$s are the four bits in a row of matrix 1104, the $v_i$s are the four bits in the corresponding row of matrix 1102, and the $L_i$s are each 4-component vectors of value, $$\{L_3, L_2, L_1, L_0\} = \{(1,1,1,1),(0,1,0,1),(0,0,1,1),(0,0,0,1)\}. \qquad (9)$$

The $L_i$s may be referred to as the coset leaders for a suitable mapping. This mapping, and any other suitable binary mapping based on another set of coset leaders, can be represented in at least two other forms, either of which may be used below when appropriate. First, the coset leaders may be extended from four four-dimensional vectors to twelve 3×4 matrices in order to represent each $M_i$ with a distinct set of coset leaders. For example, for binary mapping $M_1$, the coset leader corresponding to vector (0, 0, 1, 1) of equation (9) may be represented by the matrix, $$L_5 = \begin{bmatrix} 0 & 0 & 0 & 0 \\ 0 & 0 & 1 & 1 \\ 0 & 0 & 0 & 0 \end{bmatrix} = (0, 0, 2, 2). \qquad (10)$$

Assuming that $M_1=M_2$, the equivalent coset leader for $M_2$ may be given by, $$L_9 = \begin{bmatrix} 0 & 0 & 1 & 1 \\ 0 & 0 & 0 & 0 \\ 0 & 0 & 0 & 0 \end{bmatrix} = (0, 0, 4, 4). \qquad (11)$$

Therefore, using the matrix-based representation of the coset leaders, the first alternate form of equation (8) is given by, $$c = \sum_{i=0}^{11} \bigoplus u_i L_i. \qquad (12)$$

The second alternate form of the binary map may be used when the mapping function for each row is the same. That is, the second alternate form utilizes the property that the vector-based coset leaders, shown in equation (9), are the same for each row of matrices 1102 and 1104. Thus, the binary mapping can also be expressed as $$c(i,:) = v(i,:)G, \qquad (12)$$

where $$G = \begin{bmatrix} 1 & 1 & 1 & 1 \\ 0 & 1 & 0 & 1 \\ 0 & 0 & 1 & 1 \\ 0 & 0 & 0 & 1 \end{bmatrix}. \quad (13)$$

Note that each vector, $L_i$, of equation (9) is a column vector in matrix (13).

A binary map can be reversed and the user domain data recovered, by performing the inverse function of equation (12), or $$u(i,:) = c(i,:)G^{-1}. \quad (14)$$

The inverse of G, in the above example, is $$G^{-1} = \begin{bmatrix} 1 & 1 & 1 & 1 \\ 0 & 1 & 0 & 1 \\ 0 & 0 & 1 & 1 \\ 0 & 0 & 0 & 1 \end{bmatrix}, \quad (15)$$

which is the same as G. That is, in this scenario, G is its own inverse. This reversal from a coded domain to a user domain will hereinafter be referred to as reverse mapping, and will be utilized below in connection with FIG. 15.

As described above, upon completion of the binary map, matrix 1104 in a coded domain is obtained. The bottom row of matrix 1104 may be derived from the bottom row of matrix 1102. Thus, the binary mapping function, $M_0$, may spread the coset information from three bits in matrix 1102 into all four bits of the bottom row of matrix 1104—that is, into bits $c_0$, $c_1$, $c_2$, and $c_3$. These four bits may be referred to as coded coset information.

The binary mapping based on the coset leaders of equation (9) is a one-to-one mapping from matrix 1102 to matrix 1104. That is, each distinct matrix 1102 maps into a distinct matrix 1104. Also, each row of matrix 1102 maps into a distinct row of matrix 1104. Thus, the bottom row of matrix 1102 that contains the coset information maps distinctly into the coded coset information of matrix 1104. This is necessary to ensure that the coded coset information can be distinctly reverse mapped back into the original coset information, allowing a decoder to uniquely identify the coset that a received signal vector belongs in. The coset information is based on three bits of a row in matrix 1102, while the coded coset information is based on four bits of the corresponding row in matrix 1104. Thus, because the fourth LSB bit in matrix 1102, or $v_3$, is not part of the coset information and can take on a bit value of '1' or '0', each combination of bits for the coset information maps into two different combination of bits of coded coset information. This property will be utilized by some embodiments of a TCM decoder, which will be described below in connection with FIGS. 13-15.

Referring now to FIG. 12, the second step of the mapping from user bits to signals, referred to as a Euclidean map, is illustrated. The Euclidean mapping step may involve converting the bits of matrix 1104 (FIG. 12) into four 8 PAM signals. The conversion to 8 PAM signals may be performed by mapping each column of matrix 1104 into one of the 8 PAM dimensions. For example, the columns of matrix 1104, from left to right, may be mapped into signal dimensions 8 $PAM_0$, 8 $PAM_1$, 8 $PAM_2$, and 8 $PAM_3$. In some embodiments, for each column of matrix 1104, the mapping from binary bits to 8 PAM signals may be based on a natural labeling. For instance, if the leftmost column of matrix 1104 is $(c_{11}, c_7, c_3) = (1, 0, 1)$, which is five in natural labeling, a signal with the amplitude of the fifth signal point in FIGS. 5 and 6 may be transmitted.

Thus, using the binary mapping and Euclidean mapping described in connection with FIGS. 11 and 12, the coset information for an (8 PAM)$^4$ signal is found within the least significant bit in each dimension. By including the coded coset information in the LSBs of the four dimensions, the decoder (e.g., TCM decoder 700 of FIG. 7) that receives a noisy (8 PAM)$^4$ signal vector can decode the received signal by comparing the received signal vector to only the closest signal point vectors in the (8 PAM)$^4$ signal set. That is, for each dimension, the decoder can identify the signal points closest in Euclidean distance to the received signal vector, and can perform decoding assuming that those closest signal points include sufficient information to accurately recover the digital information. The closest signal points will hereinafter be referred to as the nearest neighbors for a dimension. An example of decoding based on nearest neighbors will be described here in connection with FIGS. 13 and 14.

Figure 14:
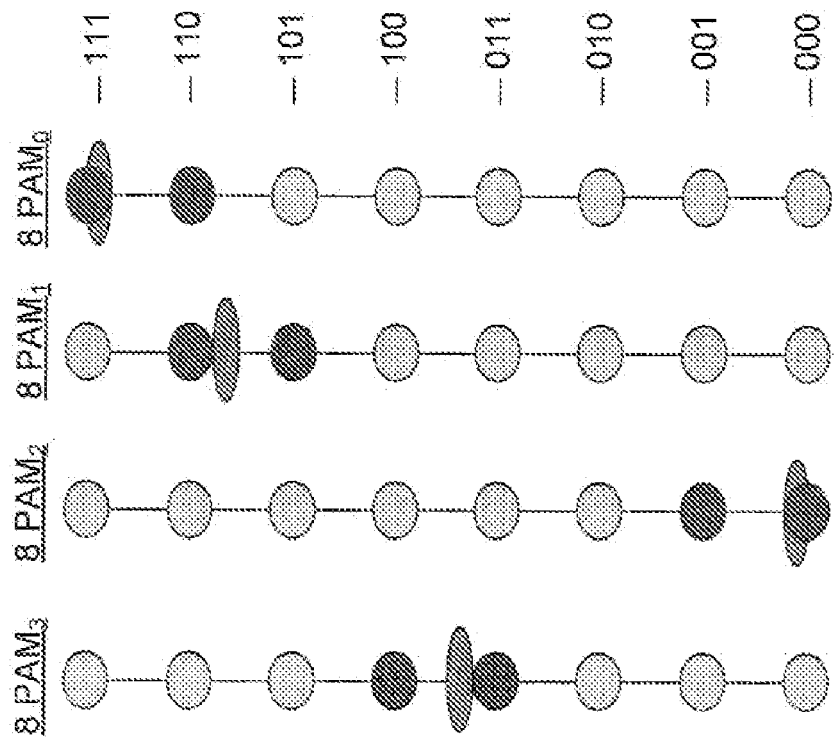
FIG. 14 illustrates the nearest neighbors needed to form a test set T(r) for the received signal vector of FIG. 13.
Figure 13:
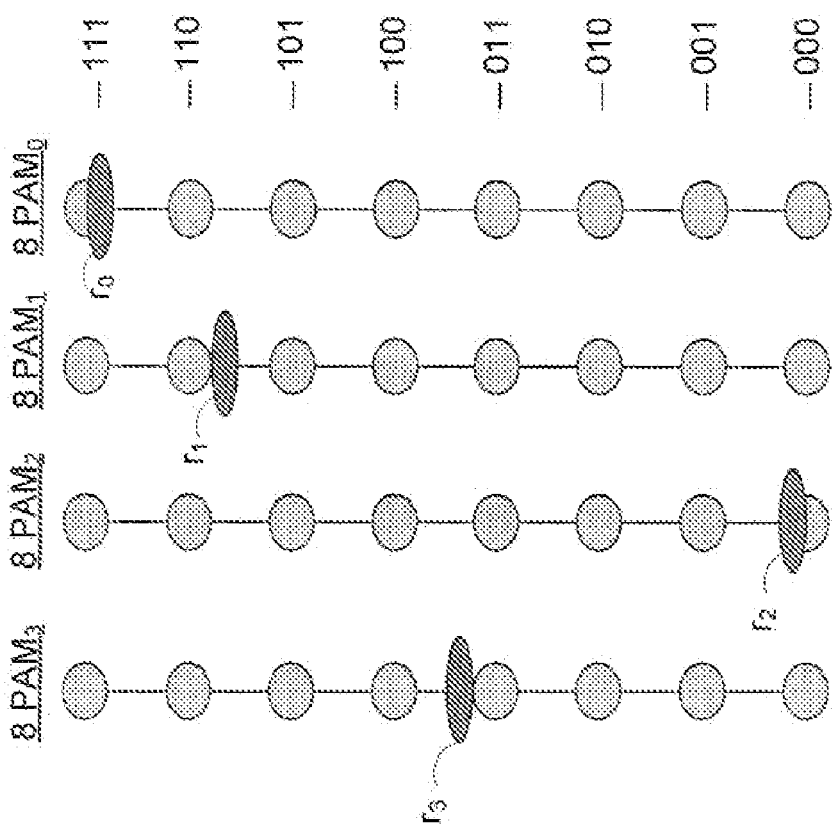
FIG. 13 shows a graphical representation of an illustrative received signal vector.

FIGS. 13 and 14 show each dimension of the (8 PAM)$^4$ signal set, referred to as 8 $PAM_0$, 8 $PAM_1$, 8 $PAM_2$, and 8 $PAM_3$, in a vertical orientation. The received signal vector is represented by one oval per dimension, and is labeled as $r = (r_0, r_1, r_2, $ and $r_3)$ in FIG. 13. FIG. 14 shows one set of nearest neighbors for each dimension of this received signal vector. Here, two nearest neighbors per dimension are identified and illustrated by darker shaded signal points. As described in greater detail below, in some embodiments, more than two nearest neighbors may be identified for each dimension.

Because a natural labeling is used in FIGS. 13 and 14, each successive 8 PAM signal point in any of the dimensions alternates in bit value for the LSB position. For example, signal point "100" (four) with a zero-valued LSB position is located between signal points "101" (five) and "011" (three), both of which have one-valued LSB positions. Therefore, for each dimension, finding the two consecutive nearest neighbors ensures that a signal point with a zero-valued LSB and signal point with a one-valued LSB are selected. Between the four dimensions, the LSBs of the identified nearest neighbors include every possible combination of the coded coset information, from c="0000" to c="1111." Moreover, the identified zero-valued and one-valued signal points are the closest signal points to the received signal vectors in each dimension. Thus, even if only the nearest neighbors are considered when decoding the received signal vector, the signal points considered are those that are most likely to be the signal points that were actually transmitted.

A TCM decoder (e.g., TCM decoder 700 of FIG. 7) can form a test set, referred to by the symbol T(r), based on the identified nearest neighbors. Test set T(r) can include 16 different test vectors by drawing one nearest neighbor from each dimension. The notation of T(r) makes clear that the values in test set T(r) depend on the value of the particular received signal vector, r. For example, test set T(r) for the signal vector illustrated in FIGS. 13 and 14 may include the 16 four-dimensional signal points, or test points, shown in Table 1 below.

TABLE 1

|    | $s_3$      | $s_2$      | $s_1$      | $s_0$      |
|----|------------|------------|------------|------------|
| 1  | "100" (4)  | "000" (0)  | "110" (6)  | "110" (6)  |
| 2  | "100" (4)  | "000" (0)  | "110" (6)  | "111" (7)  |
| 3  | "100" (4)  | "000" (0)  | "101" (5)  | "110" (6)  |
| 4  | "100" (4)  | "000" (0)  | "101" (5)  | "111" (7)  |
| 5  | "100" (4)  | "001" (1)  | "110" (6)  | "110" (6)  |
| 6  | "100" (4)  | "001" (1)  | "110" (6)  | "111" (7)  |
| 7  | "100" (4)  | "001" (1)  | "101" (5)  | "110" (6)  |
| 8  | "100" (4)  | "001" (1)  | "101" (5)  | "111" (7)  |
| 9  | "011" (3)  | "000" (0)  | "110" (6)  | "110" (6)  |
| 10 | "011" (3)  | "000" (0)  | "110" (6)  | "111" (7)  |
| 11 | "011" (3)  | "000" (0)  | "101" (5)  | "110" (6)  |
| 12 | "011" (3)  | "000" (0)  | "101" (5)  | "111" (7)  |
| 13 | "011" (3)  | "001" (1)  | "110" (6)  | "110" (6)  |
| 14 | "011" (3)  | "001" (1)  | "110" (6)  | "111" (7)  |

TABLE 1-continued

| | $s_3$ | $s_2$ | $s_1$ | $s_0$ |
|---|---|---|---|---|
| 15 | "011" (3) | "001" (1) | "101" (5) | "110" (6) |
| 16 | "011" (3) | "001" (1) | "101" (5) | "111" (7) |

Again, looking at the LSBs of T(r) in Table 1, all 16 combinations of possible LSB values are represented in the set. These possible LSB values, which correspond to different coded coset information values, can be mapped back into a user domain, and into uncoded coset information, using a one-to-one mapping. Because of the one-to-one mapping, and because only three of the reverse mapped bits are used to represent the coset information, each coset is represented by two test vectors in T(r). For example, using the coset leaders above, the first test vector and the last test vector, which have LSBs given by "0000" and "1111," respectively, reverse map to "1000" and "0000." Therefore, these test vectors correspond to the same coset, coset "000." Thus, T(r) has the advantageous property that every coset is represented.

Furthermore, for each coset, one of the two test vectors in T(r) is the signal point vector closest in Euclidean distance to the received signal vector of any signal point vector in the coset. This closest signal point vector may be the point that minimizes the Euclidean distance summation of equation (7), and is therefore the signal point vector used in the branch metric computation. Thus, a TCM decoder may consider only the signal point vectors in T(r) when making decoding decisions rather than every signal point. Compared to the decoder of FIG. 17, which computes 512 Euclidean distances for each coset, decoding by nearest neighbors reduces complexity 512/2=256 times in this embodiment. In addition, not only does decoding based on T(r) advantageously simplify branch metric computation, it simplifies the computation without degrading performance.

The ability of a decoder to rely on signal points in T(r) when making decoding decisions may depend on the mapping function chosen for the binary map. The binary map based on the coset leaders of equation (9) is only one illustrative mapping that enables this decoding feature. In general, a binary map can be specified by first defining a sequence of nested linear codes, $C_0 \supset C_1 \supset C_2 \supset C_3$. For the example above, the linear codes may be:

$C_0$: a simple (4, 4, 1) code with minimum distance of 1;
$C_1$: a (4, 3, 2) code with a parity check matrix given by H=[1 1 1 1];
$C_2$: a (4, 2, 2) code with a parity check matrix given by $$H = \begin{bmatrix} 1 & 1 & 1 & 1 \\ 1 & 0 & 1 & 0 \end{bmatrix};$$

$C_3$: a (4, 1, 4) code with a parity check matrix given by $$H = \begin{bmatrix} 1 & 1 & 1 & 1 \\ 1 & 0 & 1 & 0 \\ 1 & 1 & 0 & 0 \end{bmatrix};$$

and
$C_4$: a (4, 0, $\leq$) code with a parity check matrix given by $$H = \begin{bmatrix} 1 & 1 & 1 & 1 \\ 1 & 0 & 1 & 0 \\ 1 & 1 & 0 & 0 \\ 1 & 0 & 0 & 0 \end{bmatrix}.$$

These four codes can therefore form a partition chain, $C_0/C_1/C_2/C_3$, of $GF(2^4=16)$. The code formed by the partition chain allows for the one-to-one mapping described above, and enables the 16 possible combinations in a row of matrix 1102 (FIG. 11) to distinctly map into 16 combinations in a row of matrix 1104 (FIGS. 11 and 12), and vice versa.

Figure 15:
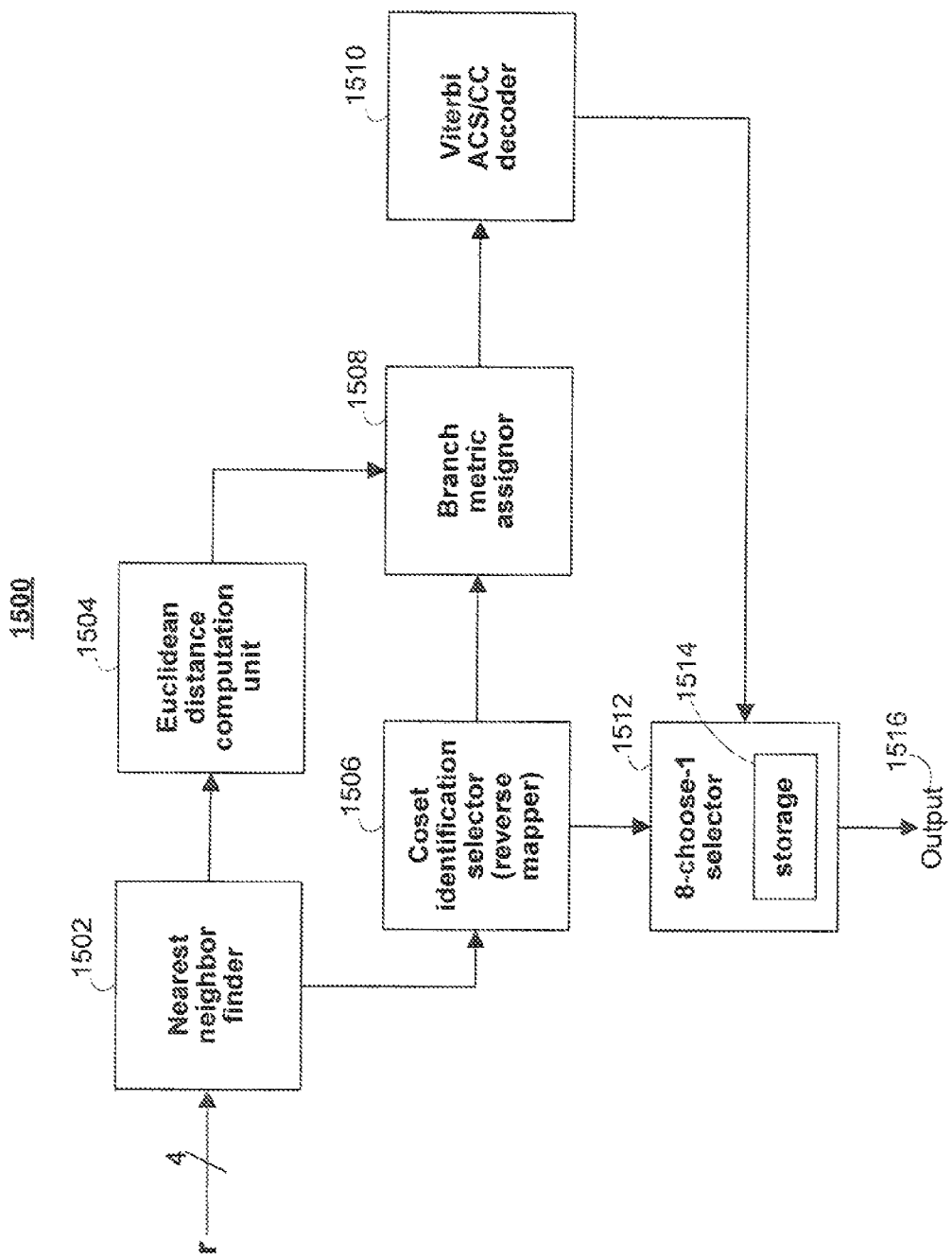
FIG. 15 shows a simplified block diagram of a TCM decoder.

Referring now to FIG. 15, a simplified and illustrative block diagram of TCM decoder 1500 is shown for decoding a signal vector based on a set of nearest neighbors. TCM decoder 1500 can include nearest neighbor finder 1502, Euclidean distance computation unit 1504, coset identification unit 1506 (also referred to as a reverse mapper), branch metric assignor 1508, Viterbi ACS/CC decoder 1510, and 8-choose-1 selector 1512. For simplicity and clarity, these components of TCM decoder 1500 will be described for a (8 PAM)$^4$ modulation scheme. However, this modulation scheme merely illustrates one embodiment of TCM decoder 1500, and is not intended to be limiting.

Nearest neighbor finder 1502 can identify two or more nearest neighbors of the received signal vector, r, in each dimension. For an (8 PAM)$^4$ signal vector, such as the signal vector shown in FIG. 13, nearest neighbor finder 1502 may locate two nearest neighbors per dimension for a total of eight signal points. Nearest neighbor finder 1502 can find these nearest neighbors using any suitable technique. In some embodiments, nearest neighbor finder 1502 can locate nearest neighbors according to the scaling/shifting and rounding technique described in detail in U.S. patent application Ser. No. 11/929,073, filed Oct. 30, 2007, which is hereby incorporated herein by reference in its entirety.

The nearest neighbors of received signal vector r, as identified by nearest neighbor finder 1502, can be provided to Euclidean distance computation unit 1504 and coset identification unit 1506. Euclidean distance computation unit 1504 may compute the Euclidean distance between the received signal vector and the nearest neighbors using any suitable hardware-based or software-based approach. For example, unit 1504 may include a hardware-based adder configured to subtract and a hardware-based multiplier configured to perform a squaring function. This hardware configuration allows unit 1504 to compute Euclidean distances based on the function, $\|s-r\|^2$. In other embodiments, Euclidean distance computation unit 1504 can be replaced by a computation unit configured to perform another suitable distance metric other than a Euclidean distance metric.

Branch metric assignor 1508, which takes the computed Euclidean distances as input, may assign each branch in a trellis diagram (e.g., the trellis diagram of FIG. 8) with a branch metric according to one of the computed Euclidean distances. In some embodiments, the branch metrics may adhere to those specified in equation (7). Thus, branch metric assignor 1508 may assign a branch with a Euclidean distance based on whether the branch is associated with a particular coset and whether the Euclidean distance is the smallest distance for that particular coset. For example, branch metric assignor 1508 may include a software or hardware implementation of a minimizing function to determine whether a Euclidean distance provided by Euclidean distance computation unit 1504 is smaller than any other Euclidean distance previously computed for the same coset. If a Euclidean distance associated with coset "111" is provided to branch metric assignor 1508, branch metric assignor 1508 may compare the Euclidean distance to a second Euclidean distance that has already been computed and is also associated with coset "111."

The current smallest Euclidean distance for each coset may be maintained in storage 1514 of 8-choose-1 selector 1512. Thus, storage 1514 may include storage space for storing the smallest Euclidean distance for each coset. For example, if there are eight possible cosets, storage 1514 may include eight storage units.

To identify the particular coset that the Euclidean distance is associated with, branch metric assignor 1508 may rely on coset information provided by coset identification unit 1506.

Coset identification unit 1506 may recover corresponding coset information for each appropriate combination of nearest neighbors provided by nearest neighbor finder 1502. That is, coset identification unit 1506 may operate on the LSBs of the test points in T(r), and may recover the coset information from the coded coset information for each test point in T(r). Coset identification unit 1506 may recover this information by reverse mapping the coded coset information—for example, by computing equations (14) and (15) above, or by computing equations derived in a similar fashion. For instance, if the LSB components of a test point vector in T(r) is (1, 0, 0, 1), coset identification unit 1506 may apply equations (14) and (15) above to obtain a vector given by (1, 1, 1, 0). Because the coset information is contained within the rightmost three bits, this signal point in T(r) is associated with coset "110" (the sixth coset). Thus, using the coset information obtained by the reverse map, branch metric assignor 1508 may have the necessary information for assigning each branch in a trellis diagram with the appropriate Euclidean distance (or branch metric) based on the coset associated with each branch.

With continuing reference to FIG. 15, Viterbi ACS/CC decoder 1510 may use the branch metrics assigned by branch metric assignor 1508 to determine the most likely path through the trellis diagram. Viterbi ACS/CC decoder 1510 may utilize an 8-state trellis diagram with 16 collapsed branches connecting states in consecutive time intervals. The 16 collapsed branches may each correspond to two parallel branches, where the two parallel branches are the test vectors in T(r) for a given coset. Viterbi ACS/CC decoder 1510 may be a Viterbi detector/decoder of any suitable software, hardware, or firmware implementation that finds a path through the collapsed trellis diagram.

Viterbi ACS/CC decoder 1510 may provide coset identification information to 8-choose-1 selector 1512. The coset identification information can take on values "000" to "111," and identifies the cosets associated with the selected path. Based on the coset identification information, 8-choose-1 selector may choose one of the Euclidean distances stored in storage 1514 to output as output 1516. Output 1516 may be used by other components of TCM decoder 1500 (not shown), or by another device, to identify a signal point vector within each of the collapsed branches, and to compute hard or soft information (e.g., LLRs) to estimate the transmitted digital information, u.

TCM decoder 1500 is merely illustrative. Any of the components of TCM decoder 1500 may be modified or combined, and any components may be added, without departing from the scope of the present invention.

Figure 16:
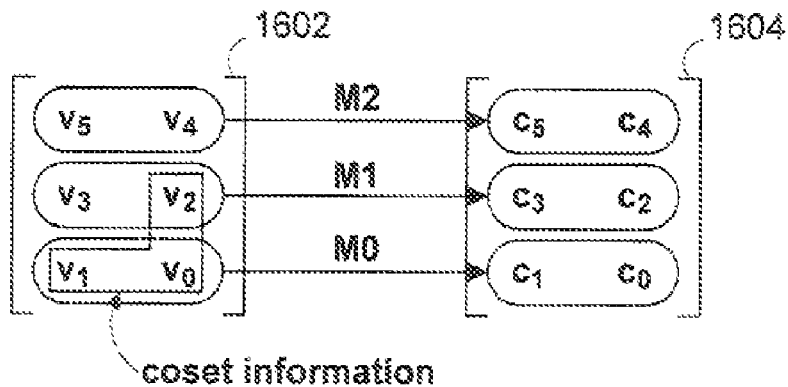
FIG. 16 illustrates binary mapping for a 2D 8 PAM scheme with eight cosets.
Figure 17:
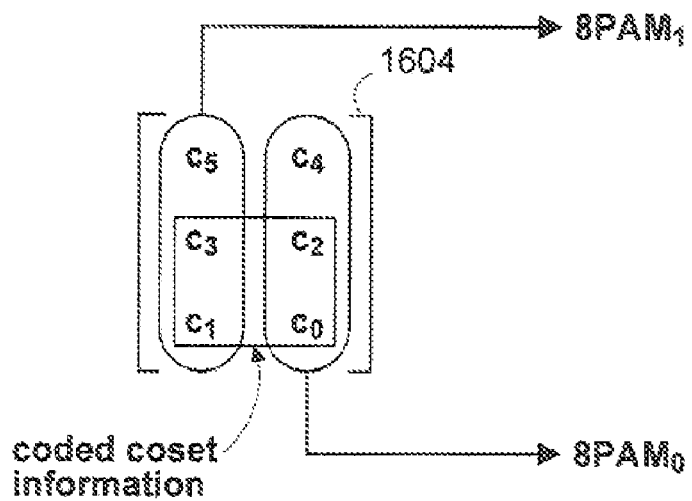
FIG. 17 illustrates Euclidean mapping for the 2D 8 PAM scheme of FIG. 16.

In some scenarios, finding two nearest neighbors in each dimension may not be sufficient to ensure that two test points for each coset are included in test set T(r). Thus, in some embodiments, TCM decoder 1500 may be configured to operate using more than two nearest neighbors. One example of a system where extending the number of nearest neighbors is necessary is described here in connection with FIGS. 16-20. FIGS. 16 and 17 show an illustrative binary map and Euclidean map for an (8 PAM)$^2$ TCM with a rate-⅔ convolutional code. These mapping steps may be performed by (8 PAM)$^2$ modulator 904 of FIG. 9, where three encoded bits, v(0) through v(2), and three uncoded bits, v(3) through v(5), are converted to two 8 PAM signals. The binary mapping may be performed with coset leaders given by {$L_0$, $L_1$}={(0, 1), (1, 1)}, or equivalently, using a binary mapping/reverse mapping matrix given by $$G = G^{-1} = \begin{bmatrix} 1 & 1 \\ 0 & 1 \end{bmatrix}.$$

As illustrated in FIG. 16, the coset information no longer fits in the LSBs of the user domain matrix, matrix 1602. In particular, the coset information is included in two of the three bits in the rightmost column of matrix 1602, rather than in only the LSB. Therefore, when the binary map is performed and matrix 1602 is converted to matrix 1604, the coded coset information is contained with the least significant two bits of each column vector. The coded coset information is highlighted in FIG. 17 for emphasis. The Euclidean map then converts matrix 1604 (FIG. 17) to two 8 PAM signals by mapping each column into a signal. Similar to before, a natural labeling may be used in the Euclidean map.

FIG. 18 shows an illustrative pair of 8 PAM signals that may correspond to a received signal vector that was transmitted according to the binary map and Euclidean map described above. FIG. 19 highlights the nearest neighbors that would be identified if two nearest neighbors were selected. As described above, the coded coset information is included within two bits of each dimension. Thus, identifying two nearest neighbors (FIG. 19) would not be sufficient to account for all possible coded coset combinations. In particular, for dimension 8 $PAM_1$, the two nearest neighbors have least significant bits of "00" and "11," and for dimension 8 $PAM_0$, the two nearest neighbors have least significant bits of "00" and "01." Therefore, identifying two nearest neighbors entirely omits out half of the coded coset combination possibilities—namely, "01" and "10" for dimension 8 $PAM_1$, and "10" and "11" for dimension 8 $PAM_0$. In fact, a test set, T(r), based on only two nearest neighbors would include only four points. Clearly, with eight different cosets, four test points is not sufficient for each coset to be represented by two test points.

Identifying four nearest neighbors, on the other hand, and as shown in FIG. 20, does provide every possible combination of the least significant two bits. Therefore, forming test set T(r) based on these nearest neighbors would produce 16 test points, each with a different value for the least significant two bits. Accordingly, using four nearest neighbors ensures that two test points are included for each coset, and that one of these two test points corresponds to the closest signal point to the received signal vector for that coset. A TCM decoder similar to TCM decoder 1500 (FIG. 15) may be implemented for this (8 PAM)$^2$ system. Nearest neighbors finder 1502, in this case, may be configured to find four nearest neighbors per dimension.

In some situations, it may not be necessary to use all four nearest neighbors when forming T(r). For example, in FIG. 20, a TCM decoder may locate only three nearest neighbors for the 8 $PAM_0$ dimension. In this scenario, the received signal is close to the edge of the 8 PAM signal constellation set. Thus, a fourth nearest neighbor would be considerably further away from the received signal than the other nearest neighbors in that dimension. Because of this distance, any test vectors formed using the fourth nearest neighbor would not be chosen as the closest test vector for any coset, and would be discarded when computing the minimizing function of equation (7). In general, the TCM decoder can obtain enough nearest neighbors to form a complete test set. A test set, T(r), is complete if and only if for each received signal vector, r, and each coset i, T(r) includes a test vector from the ith coset closest to the received signal vector. When a complete test set is formed, branch metric computation according to equation (7), or another distance-based metric, may allow a detector (e.g., Viterbi detector) to detect the received signal vector with high performance.

Figure 21:
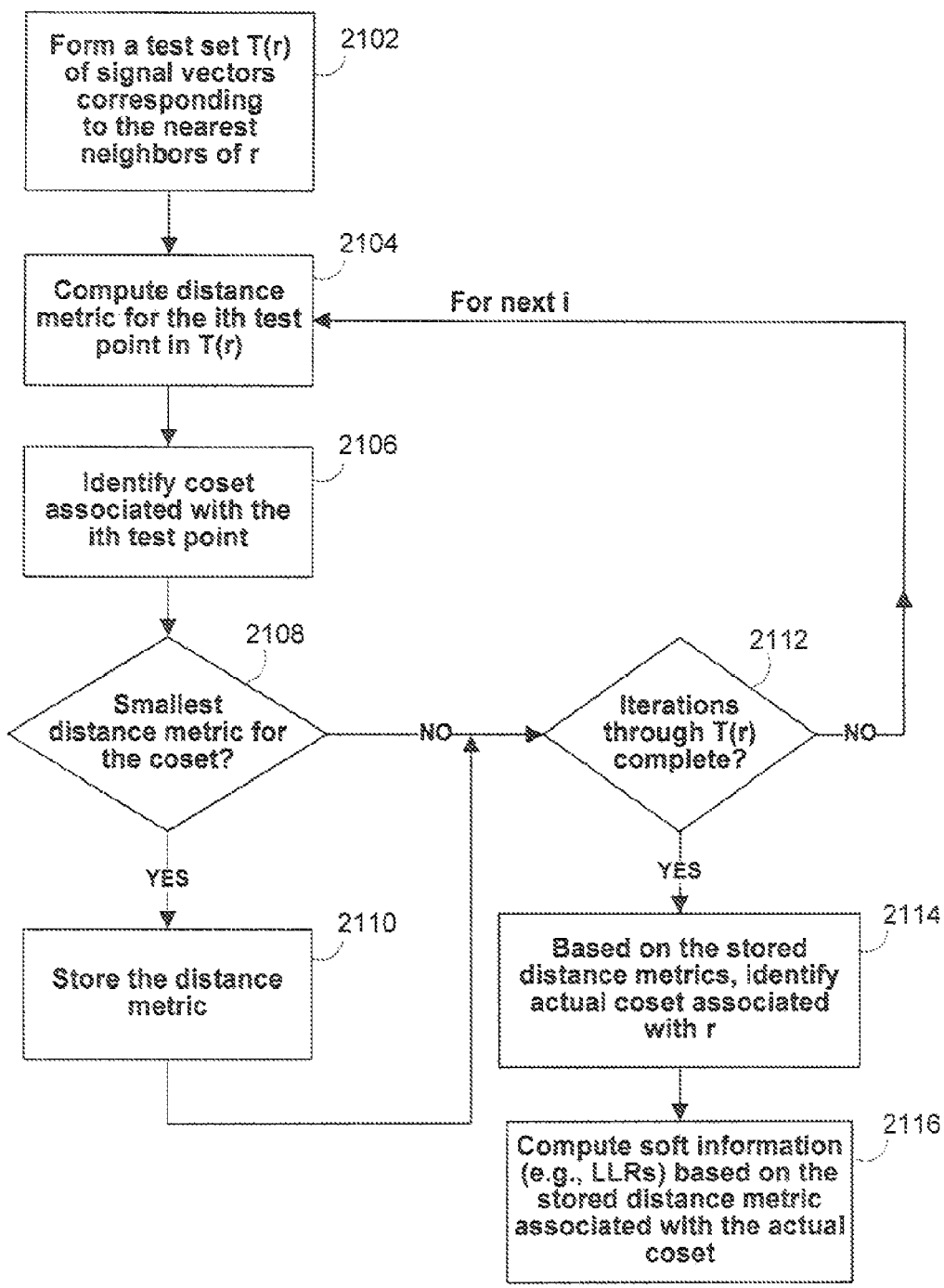
FIG. 21 shows an illustrative flow diagram for decoding a received signal vector in a multi-dimensional TCM/BCM communication or storage system.

Referring now to FIG. 21, illustrative flow diagram 2100 is shown for computing soft information for a received signal. The received signal may be based on a multi-dimensional signal constellation set, and may have been encoded using a bandwidth efficient technique. For example, the received signal may be an $(8\text{ PAM})^4$ signal utilizing trellis coded modulation. The steps of FIG. 21 may be performed by a signal detector, such as TCM decoder 1500 of FIG. 15.

At step 2102, a test set, T(r), may be formed based on an identified set of nearest neighbors. In some embodiments, test set T(r) may be a complete test set, and may be based on up to two or four (or more) nearest neighbors in each dimension. Then, at step 2104, a distance metric may be computed for a first signal point vector in T(r). For example, for the received signal vector illustrated in FIG. 13, a distance metric may be computed for the signal point vector in the first entry of Table 1. The distance metric may be based on the sum of the Euclidean distances between the signal point vector and the received signal vector in each dimension.

At step 2106, the coset associated with the first signal point vector can be identified. The coset may be identified by reverse mapping, or decoding, the part of the first signal point vector that contains the coset information. For the example of FIGS. 13 and 14, identifying the coset information may involve reverse mapping the four least significant bits of the signal point vector, and identifying the coset based on three bits of the resulting vector. After the coset is identified, at step 2108, a determination can be made as to whether the computed distance metric is the smallest distance metric computed for that coset thus far. This step may involve comparing the computed distance metric with one or more stored distance metrics associated with the same coset (e.g., stored in storage 1514 of FIG. 15). If, at step 2108, it is determined that the recently computed distance metric is the smallest branch metric, the computed distance metric may be stored (e.g., in storage 1514 of FIG. 15). This information may be stored by overwriting any previous distance metric associated with the coset. Otherwise, if the computed distance metric is not the smallest for the coset, this information is not stored.

With continuing reference to FIG. 21, at step 2112, a determination can be made as to whether all of the signal point vectors in T(r) have been considered. If not, the flow may return to step 2104 to compute a distance metric for the next signal point vector in T(r). If so, distance metrics have been computed for all the signal point vectors in T(r) (e.g., all 16 signal points vectors in Table 1), and distance metric computation may be complete. In this scenario, the memory maintaining the smallest distance metric for each coset may completely reflect the information for the current signal vector, and may be used in computing branch metrics. At step 2114, the stored distance metrics may be used to identify the actual coset associated with the received signal. For example, in some embodiments, the actual coset may be obtained using a Viterbi algorithm, where the Viterbi algorithm proceeds by utilizing the stored minimum distance metrics as branch metrics. Then, at step 2116, soft or hard information can be computed based on the stored distance metric associated with the actual coset, and based on any other suitable information obtained at step 2114. The soft information computed in step 2116 may include log-likelihood ratios.

Referring now to FIGS. 22-28, various exemplary implementations of the present invention are shown.

Figure 22:
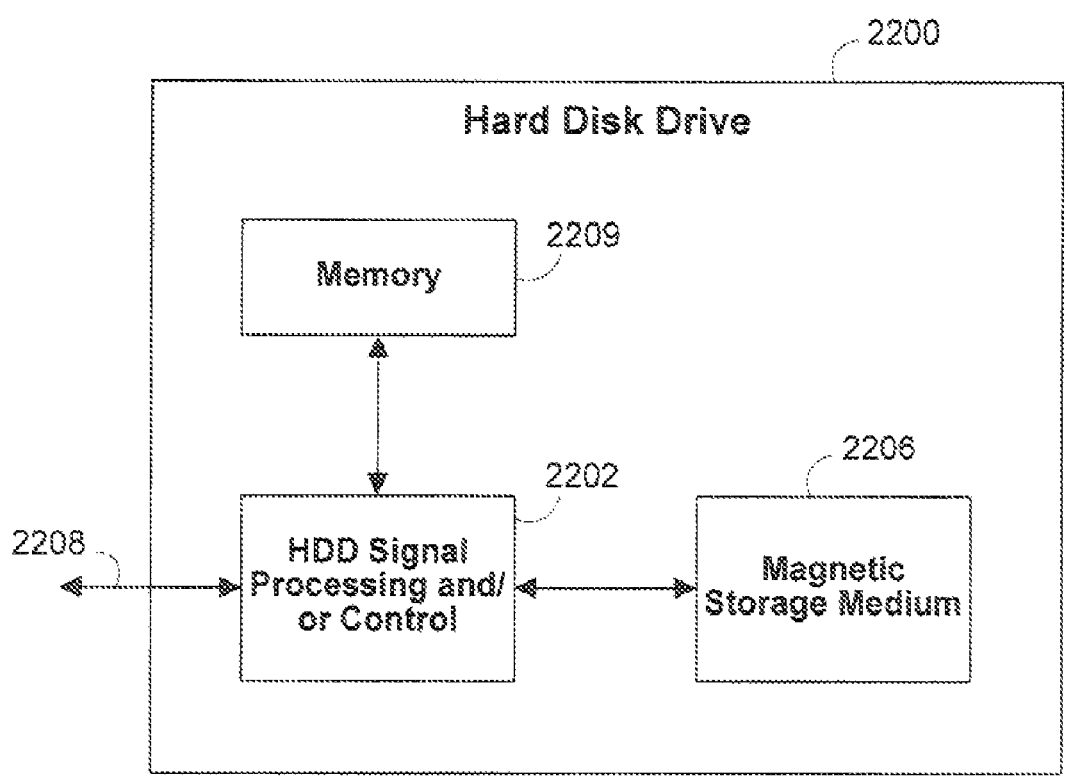
FIG. 22 is a block diagram of an exemplary hard disk drive that can employ the disclosed technology.

Referring now to FIG. 22, the present invention can be implemented in a hard disk drive (HDD) 2200. The present invention may implement either or both signal processing and/or control circuits, which are generally identified in FIG. 22 at 2202. In some implementations, the signal processing and/or control circuit 2202 and/or other circuits (not shown) in the HDD 2200 may process data, perform coding and/or encryption, perform calculations, and/or format data that is output to and/or received from a magnetic storage medium 2206.

The HDD 2200 may communicate with a host device (not shown) such as a computer, mobile computing devices such as personal digital assistants, cellular phones, media or MP3 players and the like, and/or other devices via one or more wired or wireless communication links 2208. The HDD 2200 may be connected to memory 2209 such as random access memory (RAM), nonvolatile memory such as flash memory, read only memory (ROM) and/or other suitable electronic data storage.

Figure 23:
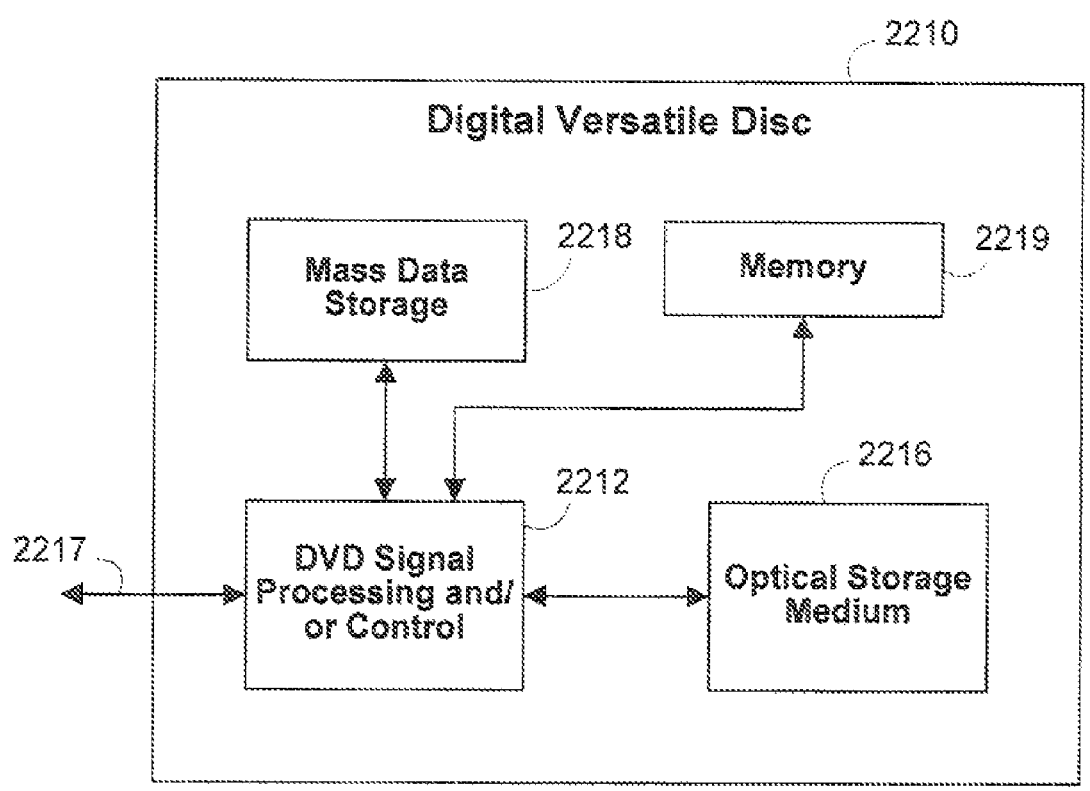
FIG. 23 is a block diagram of an exemplary digital versatile disc that can employ the disclosed technology.

Referring now to FIG. 23, the present invention can be implemented in a digital versatile disc (DVD) drive 2210. The present invention may implement either or both signal processing and/or control circuits, which are generally identified in FIG. 23 at 2212, and/or mass data storage 2218 of the DVD drive 2210. The signal processing and/or control circuit 2212 and/or other circuits (not shown) in the DVD drive 2210 may process data, perform coding and/or encryption, perform calculations, and/or format data that is read from and/or data written to an optical storage medium 2216. In some implementations, the signal processing and/or control circuit 2212 and/or other circuits (not shown) in the DVD drive 2210 can also perform other functions such as encoding and/or decoding and/or any other signal processing functions associated with a DVD drive.

The DVD drive 2210 may communicate with an output device (not shown) such as a computer, television or other device via one or more wired or wireless communication links 2217. The DVD drive 2210 may communicate with mass data storage 2218 that stores data in a nonvolatile manner. The mass data storage 2218 may include a hard disk drive (HDD). The HDD may have the configuration shown in FIG. 22. The HDD may be a mini HDD that includes one or more platters having a diameter that is smaller than approximately 1.8". The DVD drive 2210 may be connected to memory 2219 such as RAM, ROM, nonvolatile memory such as flash memory and/or other suitable electronic data storage.

Figure 24:
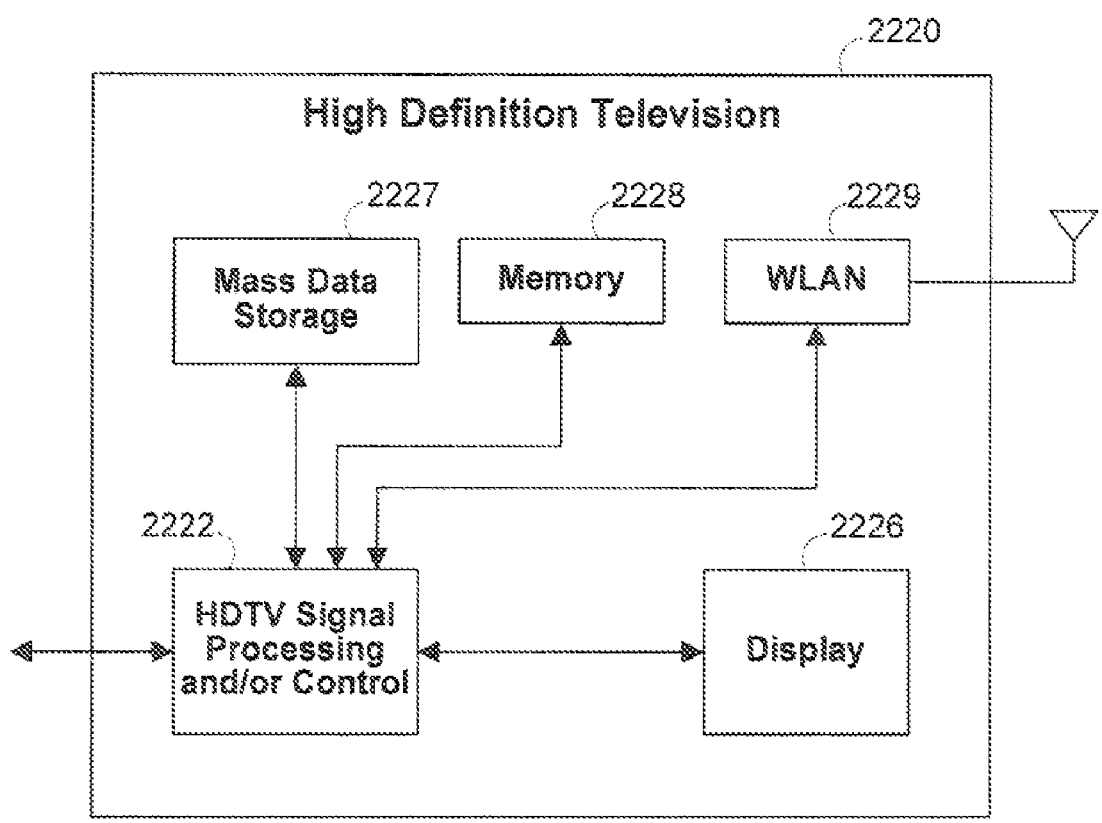
FIG. 24 is a block diagram of an exemplary high definition television that can employ the disclosed technology.

Referring now to FIG. 24, the present invention can be implemented in a high definition television (HDTV) 2220. The present invention may implement either or both signal processing and/or control circuits, which are generally identified in FIG. 24 at 2222, a WLAN network interface 2229 and/or mass data storage 2227 of the HDTV 2220. In one implementation, the HDTV 2220 receives HDTV input signals in either a wired or wireless format and generates HDTV output signals for a display 2226. In some implementations, signal processing circuit and/or control circuit 2222 and/or other circuits (not shown) of the HDTV 2220 may process data, perform coding and/or encryption, perform calculations, format data and/or perform any other type of HDTV processing that may be required.

The HDTV 2220 may communicate with mass data storage 2227 that stores data in a nonvolatile manner such as optical and/or magnetic storage devices for example hard disk drives HDD and/or DVDs. At least one HDD may have the configuration shown in FIG. 22 and/or at least one DVD may have the configuration shown in FIG. 23. The HDD may be a mini HDD that includes one or more platters having a diameter that is smaller than approximately 1.8". The HDTV 2220 may be connected to memory 2228 such as RAM, ROM, nonvolatile memory such as flash memory and/or other suitable electronic data storage. The HDTV 2220 also may support connections with a WLAN via WLAN network interface 2229.

Figure 25:
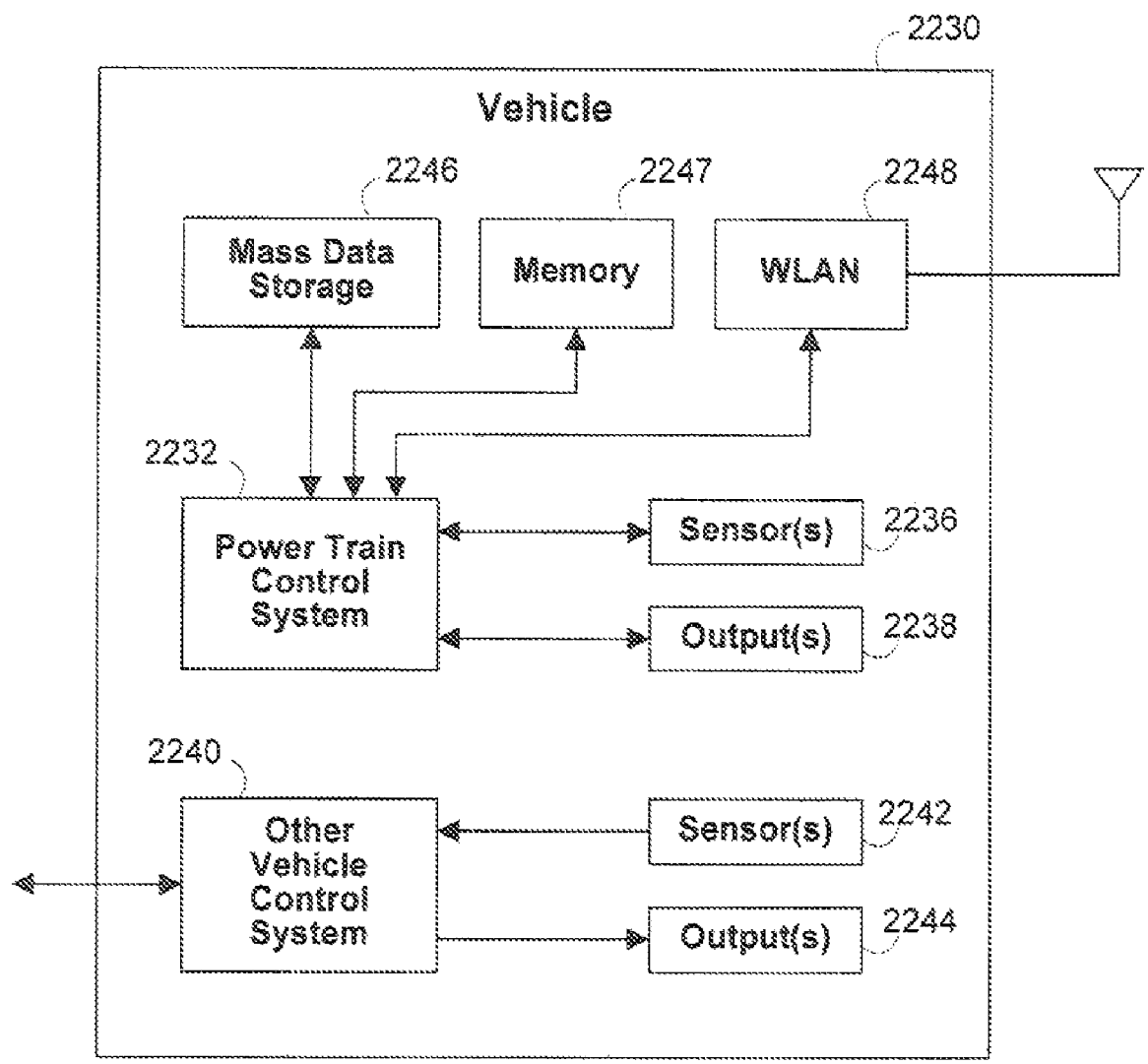
FIG. 25 is a block diagram of an exemplary vehicle that can employ the disclosed technology.

Referring now to FIG. 25, the present invention can be implemented in a control system of a vehicle 2230, a WLAN network interface 2248 and/or mass data storage 2246 of the vehicle control system. In some implementations, the present invention may implement a powertrain control system 2232 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be implemented in other control systems 2240 of the vehicle 2230. The control system 2240 may likewise receive signals from input sensors 2242 and/or output control signals to one or more output devices 2244. In some implementations, the control system 2240 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 2232 may communicate with mass data storage 2246 that stores data in a nonvolatile manner. The mass data storage 2246 may include optical and/or magnetic storage devices for example hard disk drives HDD and/or DVDs. At least one HDD may have the configuration shown in FIG. 22 and/or at least one DVD may have the configuration shown in FIG. 23. The HDD may be a mini HDD that includes one or more platters having a diameter that is smaller than approximately 1.8". The powertrain control system 2232 may be connected to memory 2247 such as RAM, ROM, nonvolatile memory such as flash memory and/or other suitable electronic data storage. The powertrain control system 2232 also may support connections with a WLAN via WLAN network interface 2248. The control system 2240 may also include mass data storage, memory and/or a WLAN interface (all not shown).

Figure 26:
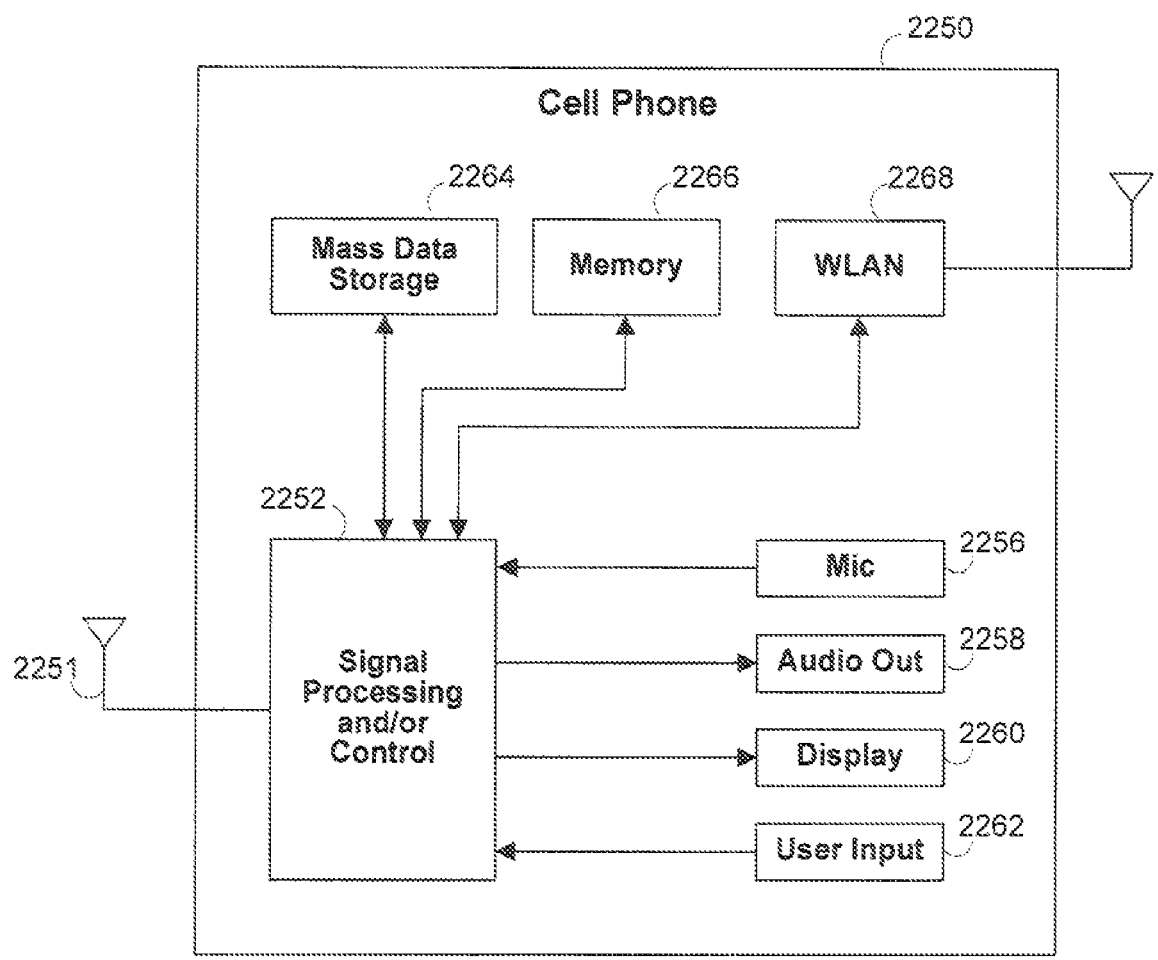
FIG. 26 is a block diagram of an exemplary cell phone that can employ the disclosed technology.

Referring now to FIG. 26, the present invention can be implemented in a cellular phone 2250 that may include a cellular antenna 2251. The present invention may implement either or both signal processing and/or control circuits, which are generally identified in FIG. 26 at 2252, a WLAN network interface 2268 and/or mass data storage 2264 of the cellular phone 2250. In some implementations, the cellular phone 2250 includes a microphone 2256, an audio output 2258 such as a speaker and/or audio output jack, a display 2260 and/or an input device 2262 such as a keypad, pointing device, voice actuation and/or other input device. The signal processing and/or control circuits 2252 and/or other circuits (not shown) in the cellular phone 2250 may process data, perform coding and/or encryption, perform calculations, format data and/or perform other cellular phone functions.

The cellular phone 2250 may communicate with mass data storage 2264 that stores data in a nonvolatile manner such as optical and/or magnetic storage devices for example hard disk drives HDD and/or DVDs. At least one HDD may have the configuration shown in FIG. 22 and/or at least one DVD may have the configuration shown in FIG. 23. The HDD may be a mini HDD that includes one or more platters having a diameter that is smaller than approximately 1.8". The cellular phone 2250 may be connected to memory 2266 such as RAM, ROM, nonvolatile memory such as flash memory and/or other suitable electronic data storage. The cellular phone 2250 also may support connections with a WLAN via WLAN network interface 2268.

Figure 27:
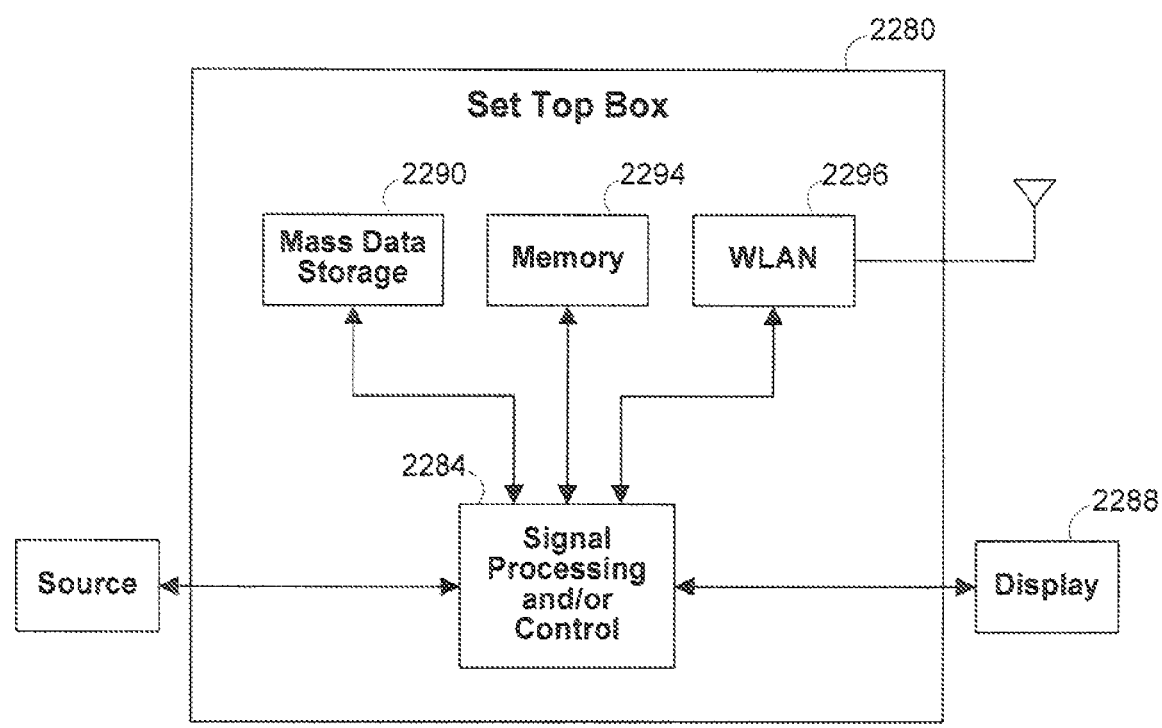
FIG. 27 is a block diagram of an exemplary set top box that can employ the disclosed technology.

Referring now to FIG. 27, the present invention can be implemented in a set top box 2280. The present invention may implement either or both signal processing and/or control circuits, which are generally identified in FIG. 27 at 2284, a WLAN network interface 2296 and/or mass data storage 2290 of the set top box 2280. In one implementation, the set top box 2280 receives signals from a source such as a broadband source and outputs standard and/or high definition audio/video signals suitable for a display 2288 such as a television and/or monitor and/or other video and/or audio output devices. The signal processing and/or control circuits 2284 and/or other circuits (not shown) of the set top box 2280 may process data, perform coding and/or encryption, perform calculations, format data and/or perform any other set top box function.

The set top box 2280 may communicate with mass data storage 2290 that stores data in a nonvolatile manner. The mass data storage 2290 may include optical and/or magnetic storage devices for example hard disk drives HDD and/or DVDs. At least one HDD may have the configuration shown in FIG. 22 and/or at least one DVD may have the configuration shown in FIG. 23. The HDD may be a mini HDD that includes one or more platters having a diameter that is smaller than approximately 1.8". The set top box 2280 may be connected to memory 2294 such as RAM, ROM, nonvolatile memory such as flash memory and/or other suitable electronic data storage. The set top box 2280 also may support connections with a WLAN via WLAN network interface 2296.

Figure 28:
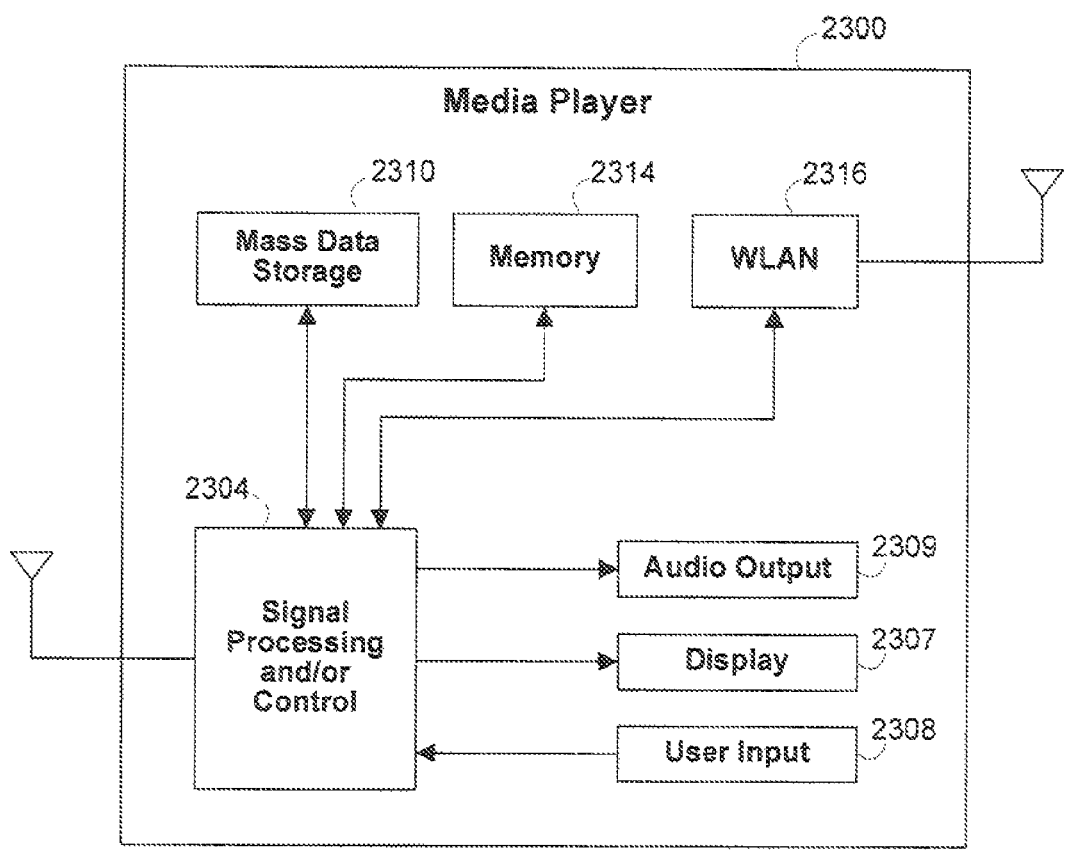
FIG. 28 is a block diagram of an exemplary media player that can employ the disclosed technology.

Referring now to FIG. 28, the present invention can be implemented in a media player 2300. The present invention may implement either or both signal processing and/or control circuits, which are generally identified in FIG. 28 at 2304, a WLAN network interface 2316 and/or mass data storage 2310 of the media player 2300. In some implementations, the media player 2300 includes a display 2307 and/or a user input 2308 such as a keypad, touchpad and the like. In some implementations, the media player 2300 may employ a graphical user interface (GUI) that typically employs menus, drop down menus, icons and/or a point-and-click interface via the display 2307 and/or user input 2308. The media player 2300 further includes an audio output 2309 such as a speaker and/or audio output jack. The signal processing and/or control circuits 2304 and/or other circuits (not shown) of the media player 2300 may process data, perform coding and/or encryption, perform calculations, format data and/or perform any other media player function.

The media player 2300 may communicate with mass data storage 2310 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 22 and/or at least one DVD may have the configuration shown in FIG. 23. The HDD may be a mini HDD that includes one or more platters having a diameter that is smaller than approximately 1.8". The media player 2300 may be connected to memory 2314 such as RAM, ROM, nonvolatile memory such as flash memory and/or other suitable electronic data storage. The media player 2300 also may support connections with a WLAN via WLAN network interface 2316. Still other implementations in addition to those described above are contemplated.

The foregoing describes systems and methods for decoding a TCM/BCM-encoded multi-dimensional signal vector based on a test set formed from nearest neighbors. Implementations of the invention can be practiced by other than the described embodiments, which are presented for the purpose of illustration rather than of limitation.

What is claimed is:

1. A method of processing a multi-dimensional signal vector, wherein the multi-dimensional signal vector is associated with one of a plurality of cosets, the method comprising:
    forming a set of multi-dimensional test vectors based on nearest neighbors of the multi-dimensional signal vector, wherein each multi-dimensional test vector is associated with one of the plurality of cosets;
    computing one or more distance metrics for each multi-dimensional test vector;
    for each coset, identifying a smallest of the computed distance metrics associated with that coset;
    estimating which coset the multi-dimensional signal vector belongs in based on the smallest computed distance metrics; and
    recovering information from the multi-dimensional signal vector based on the estimated coset.

2. The method of claim 1, wherein the multi-dimensional signal vector is derived from a system employing one of trellis coded modulation and block coded modulation.

3. The method of claim 1, wherein forming the set of multi-dimensional test vectors comprises forming a complete test set for the multi-dimensional signal vector.

4. The method of claim 1, wherein the set of multi-dimensional test vectors comprises at least one test vectors associated with each coset.

5. The method of claim 1, wherein least significant bits of each multi-dimensional test vector includes information on which coset that test vector belongs in.

6. The method of claim 1, wherein computing one or more distance metrics comprises computing a sum of the squared Euclidean distances between the multi-dimensional test vector and the multi-dimensional signal vector in each dimension.

7. The method of claim 1, further comprising identifying which coset each multi-dimensional test vector is associated with.

8. The method of claim 7, wherein identifying which coset comprises reverse mapping coded coset information included in each multi-dimensional test vector to coset identifying information.

9. The method of claim 1, wherein identifying the smallest of the computed distance metrics comprises:
    determining whether a distance metric is smaller than a previously computed distance metric associated with the same coset;
    storing the distance metric in response to the distance metric being smaller; and
    disregarding the distance metric in response to the distance metric being greater.

10. The method of claim 1, wherein recovering the information from the multi-dimensional signal vector comprises computing log-likelihood ratios.

11. A method of processing a multi-dimensional signal vector, wherein the multi-dimensional signal vector is associated with one of a plurality of cosets, the method comprising:
    receiving the multi-dimensional signal vector;
    identifying at least two nearest neighbors in each dimension of the received multi-dimensional signal vector;
    producing a set of multi-dimensional test vectors, wherein each multi-dimensional test vector is based on a different combination of the nearest neighbors;
    computing branch metrics for branches of a trellis diagram based on the set of multi-dimensional test vectors;
    identifying a branch in the trellis diagram using the branch metrics; and
    recovering information in the multi-dimensional signal vector based on the identified branch.

12. The method of claim 11, wherein the set of multi-dimensional test vectors comprises the closest test vector to the multi-dimensional signal vector for each coset.

13. The method of claim 11, wherein each branch of the trellis diagram is associated with a coset, and wherein recovering the information in the multi-dimensional signal vector comprises identifying a multi-dimensional test vector associated with the coset of the identified branch.

14. The method of claim 11, wherein identifying the at least two nearest neighbors in each dimension comprises, for each dimension, selecting two one-dimensional signal points closest in Euclidean distance to that dimension of the received multi-dimensional signal vector.

15. The method of claim 11, wherein computing branch metric for the i-th coset comprises computing the equation, $$\min_{\substack{\{s_0,\ldots,s_{M-1}\}\in T(r) \\ \{s_0,\ldots,s_{M-1}\}\in i-th\,coset}} \left\{ \sum_{j=0}^{M} (r_j - s_j)^2 \right\},$$

where M is the number of dimensions in the received multi-dimensional signal vector, T(r) is the set of multi-dimensional test vectors, $r_j$ is the received signal, and $s_j$ is the corresponding transmitted signal, in the j-th dimension, respectively.

16. The method of claim 11, wherein identifying the branch in the trellis diagram comprises selecting a branch using a Viterbi algorithm.

17. A decoder for processing a multi-dimensional signal vector, wherein the multi-dimensional signal vector is associated with one of a plurality of cosets, the decoder comprising logic configured to:
    form a set of multi-dimensional test vectors based on nearest neighbors of the multi-dimensional signal vector, wherein each multi-dimensional test vector is associated with one of the plurality of cosets;
    compute one or more distance metrics for each multi-dimensional test vector;
    identify, for each coset, a smallest of the computed distance metrics associated with that coset;
    estimate which coset the multi-dimensional signal vector belongs in based on the smallest computed distance metrics; and
    recover information from the multi-dimensional signal vector based on the estimated coset.

18. The decoder of claim 17, wherein the logic configured to compute a distance metric is further configured to compute a sum of the squared Euclidean distances between the multi-dimensional test vector and the multi-dimensional signal vector in each dimension.

19. The decoder of claim 17, wherein the logic is further configured to identify which coset each multi-dimensional test vector is associated with.

20. The decoder of claim 17, wherein the logic configured to identify the smallest of the computed distance metrics is further configured to:
    determine whether a distance metric is smaller than a previously computed distance metric associated with the same coset;
    store the distance metric in response to the distance metric being smaller; and
    disregard the distance metric in response to the distance metric being greater.

* * * * *